(12) United States Patent
Baumgartner et al.

(10) Patent No.: US 8,578,311 B1
(45) Date of Patent: Nov. 5, 2013

(54) METHOD AND SYSTEM FOR OPTIMAL DIAMETER BOUNDING OF DESIGNS WITH COMPLEX FEED-FORWARD COMPONENTS

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/467,425

(22) Filed: May 9, 2012
(Under 37 CFR 1.47)

(51) Int. Cl.
*G06F 17/50* (2006.01)
(52) U.S. Cl.
USPC ............ 716/108; 716/107; 716/113; 716/134
(58) Field of Classification Search
USPC .................................. 716/107–108, 113, 134
See application file for complete search history.

(56) References Cited

U.S. PATENT DOCUMENTS

| | | | |
|---|---|---|---|
| 6,018,621 A * | 1/2000 | Puri et al. ....................... | 716/103 |
| 6,789,223 B2 | 9/2004 | Fetherson | |
| 7,000,205 B2 | 2/2006 | Devgan et al. | |
| 7,203,631 B2 | 4/2007 | Fraer et al. | |
| 7,581,170 B2 | 8/2009 | Baumgartner et al. | |
| 7,596,770 B1 | 9/2009 | Kuehlmann et al. | |
| 7,865,339 B2 | 1/2011 | Rushby et al. | |
| 8,001,498 B2 | 8/2011 | Bjesse | |
| 8,181,134 B2 | 5/2012 | Baumgartner et al. | |
| 8,255,848 B2 | 8/2012 | Baumgartner et al. | |
| 8,261,221 B2 * | 9/2012 | Singhal et al. ................ | 716/113 |
| 2010/0005454 A1 | 1/2010 | Sankaranarayanan et al. | |
| 2010/0223584 A1 | 9/2010 | Baumgartner et al. | |
| 2011/0041114 A1 | 2/2011 | Komatsu | |

OTHER PUBLICATIONS

Girard et al., A reconvergent Fanout Analysis for the CPT Algorithm Using in Delay-Fault Diagosis, 1933, IEEE, pp. 83-88.*
Liou, et al., Fast Statistical Timing Analysis by Probabilistic Event Propagation, DAC 2001, Jun. 18-22, 2001, Las Vegas, Nevada, USA.
Devgan et al., Block-based Static Timing Analysis with Uncertainty, ICCAD '03, Nov. 11-13, 2003, San Jose, California, USA.
Choudhury et al., Accurate and Scalable Reliability Analysis of Logic Circuits, EEDA, 2007.

(Continued)

*Primary Examiner* — Nghia Doan
(74) *Attorney, Agent, or Firm* — Yudell Isidore Ng Russell PLLC

(57) ABSTRACT

A computer-implemented method includes a processor identifying, within the netlist, at least one strongly connected components (SCCs) that has a reconvergent fanin input with at least two input paths from the reconvergent fanin input having a different propagation delay to the SCC. The method then computes an additive diameter for the netlist comprising at least one SCC, where the additive diameter includes a fanin additive diameter determined based on a propagation delay difference of the at least two input paths to a SCC and a number of complex feed-forward components within at least one input path. In response to the reconvergent fanin input to the SCC providing a binate function, the method computes a multiplicative diameter for the SCC utilizing a least common multiple (LCM) derived from one or more propagation delay differences across each reconvergent fanin input leading to the SCC.

22 Claims, 10 Drawing Sheets

(56) References Cited

OTHER PUBLICATIONS

Chao et al., Static Statistical Timing Analysis for Latch-based Pipeline Designs, In the Proceedings of the 2004 IEEE/ACM International Conference on Computer-Aided Design (ICCAD '-4) pp. 1-5.).

Casu, M.R. et al., A New Approach to Latency Insensitive Design, In Proceedings of the 41st Annual Design Automation Conference (DAC '04), ACM, pp. 576-581.

Baba, A.H, et al., Testing for Transistor Aging, 27th IEEE VLSI Test Symposium (VTS '09), pp. 215-220.

U.S. Appl. No. 13/455,789 entitled "Method and System for Optimal Counterexample-Guided Proof-Based Abstraction"; Non-final office action dated Nov. 9, 2012 (7 pg.).

U.S. Appl. No. 13/455,789 entitled "Method and System for Optimal Counterexample-Guided Proof-Based Abstraction"; Notice of Allowance dated Apr. 30, 2013 (8 pg.).

U.S. Appl. No. 13/455,839 entitled "Constructing Inductive Counterexamples in a Multi-algorithm Verification Framework"; Ex-Parte Quayle action dated Apr. 25, 2013 (8 pg.).

Hiang, et al., "Inductive Equivalence Checking under Retiming and Resynthesis", 2007 IEEE/ACM International Conference on Computer-Aided Design, Conference publication pp. 326-333.

Chang et al., "Simulation-based Bug Trace Minimization with BMC-based Refinement", IEEE 2005. pp. 1045-1051.

Chou, et al., "Facilitating Unreachable Code Diagnostics and Debugging", IEEE 2011.

Wedler, et al., "Exploiting State Encoding for Invariant Generation in Induction-based Property Checking, 2004 IEEE Design Automation Conference", Proceedings of the ASP-DAC 2004, pp. 424-429.

* cited by examiner

| EXAMPLE SUB-NETLIST | (MAX, MIN) | DELTA | ADDITIVE DIAMETER | LCM | MULTIPLICATIVE DIAMETER | DIAMETER OVER - APPROXIMATION |
|---|---|---|---|---|---|---|
| FIG. 3A: $D(CI) = 4$ | (1, 0) | 1 | 3 | 1 | 4 | 7 |
| FIG. 3B $D(CI) = 4$ | (1, 0) | 1 | 3 | 2 | 8 | 11 |
| FIG. 3C $D(CI) = 4$ | (3, 2) | 1 | 5 | 2 | 8 | 13 |

FIG. 8

METHOD AND SYSTEM FOR OPTIMAL DIAMETER BOUNDING OF DESIGNS WITH COMPLEX FEED-FORWARD COMPONENTS

BACKGROUND

1. Technical Field

The present disclosure generally relates to verification techniques for logic design and in particular to techniques for performing diameter bounding for complex feed-forward components in a logic design.

2. Description of the Related Art

Design verification refers to the process of establishing the correctness of a given logic design. Due to the complexity of modern logic designs, formal verification methods are gaining widespread use to augment the coverage shortcomings of simulation-based validation approaches. Formal verification methods are exhaustive, and thus are guaranteed to expose all possible logic flaws. In contrast, simulation-based validation is incomplete, and thus may fail to expose certain logic flaws (or bugs). While formal verification is a very powerful technology, formal verification generally requires exponential resources with respect to design size and thus is often only applicable to smaller design components. Semi-formal methods attempt to leverage the exhaustive bug-hunting power of formal verification techniques in an incomplete way. For example, symbolic simulation techniques exhaustively analyze design behavior for a specific number of bounded time-frames. Algorithms to perform such bounded formal verification are often of much greater scalability than those for unbounded formal verification. However, the bounded nature of this approach implies incompleteness. That is, performing a check for time-frames 0 to k does not necessarily imply that no violation will occur at time-frames greater than k.

With some of these bounded verification techniques, a diameter can be established. The term "diameter" refers to the number of time-frames necessary to exhaustively analyze all design behaviors. If the diameter of a design is known, the diameter can enable the use of more scalable bounded verification algorithms in a complete way. Unfortunately, techniques to tightly estimate design diameter are generally as complex as the process of verification itself.

BRIEF SUMMARY

Disclosed are a method, a computing device and a computer program product that implement a technique for determining a tight diameter bound over-approximation for logic designs with intricate and/or complex feed-forward components with reconvergent fanout of varying delay paths. Specifically, an embodiment of the disclosure provide a method for determining a diameter bound for evaluating complex feed-forward components within a netlist. The method includes a processor identifying from a netlist one or more strongly connected component within the netlist, where a strongly connected component is a component that can fan out to itself. The method includes identifying acyclic registers in two or more input paths to a first strongly connected component from a first input, wherein each path has a different propagation delay; computing an additive diameter for the first complex feed-forward component; and computing a multiplicative diameter for the first complex feed-forward component. The method further includes determining a final additive diameter bound and computing a final multiplicative diameter bound for the subnetlist, then adding the final additive diameter bound to the final multiplicative diameter bound to generate a diameter bound over-approximation for utilization during bounded model checking of a subnetlist having the complex feed-forward component(s).

According to one embodiment, a computer-implemented method includes a processor identifying, within the netlist, at least one strongly connected components (SCCs) that has a reconvergent fanin input with at least two input paths from the reconvergent fanin input having a different propagation delay to the SCC. The method then computes an additive diameter for the netlist comprising at least one SCC, where the additive diameter includes a fanin additive diameter determined based on a propagation delay difference of the at least two input paths to a SCC and a number of complex feed-forward components within at least one input path. In response to the reconvergent fanin input to the SCC providing a binate function, the method computes a multiplicative diameter for the SCC utilizing a least common multiple (LCM) derived from one or more propagation delay differences across each reconvergent fanin input leading to the SCC.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments is to be read in conjunction with the accompanying drawings, wherein:

FIG. 8 is a table illustrating example results from the computation of the diameter bounds utilizing the various methods described herein with the example sub-circuits of FIGS. 3A-3C, according to one or more embodiments.

DETAILED DESCRIPTION

Figure 1:
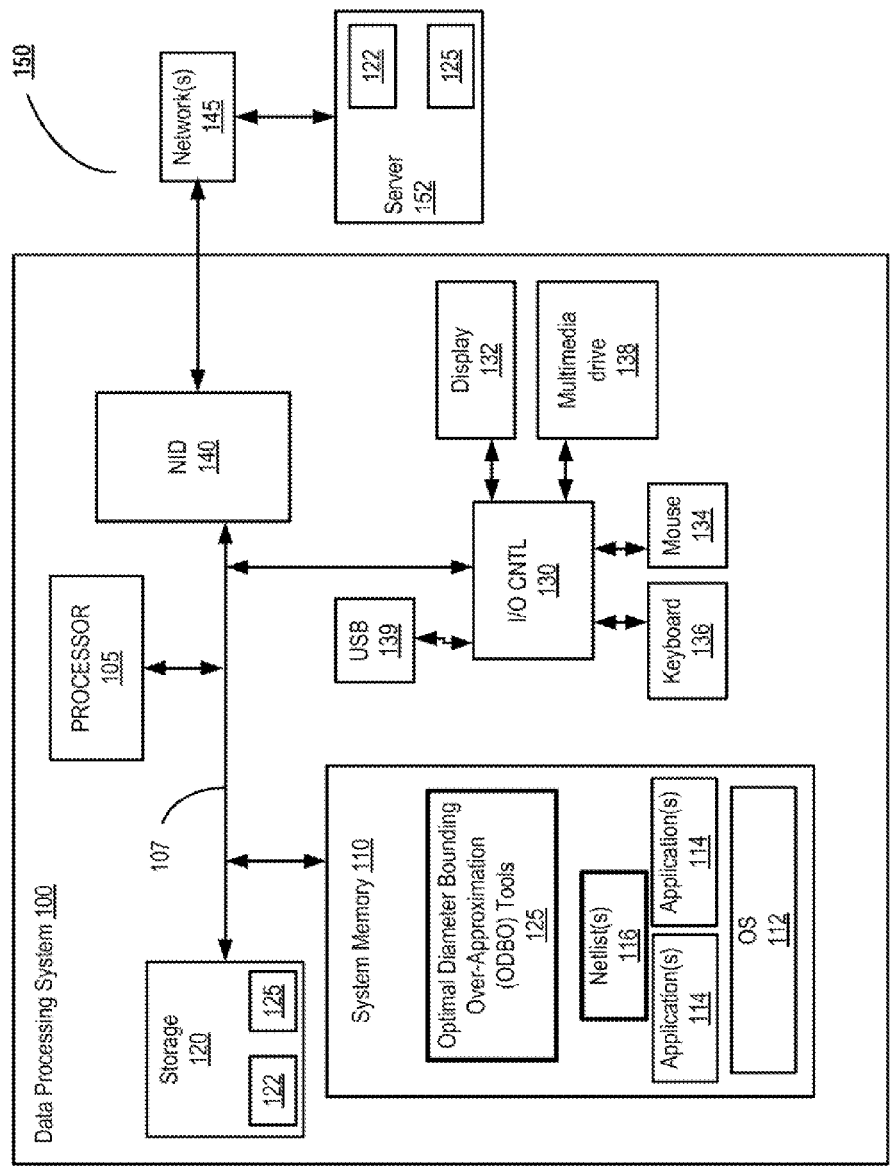
FIG. 1 provides a block diagram representation of an example data processing system within which the various embodiments of the disclosure can advantageously be implemented, according to one embodiment.

The illustrative embodiments provide a method, a computing device and a computer program product that implement a technique for determining a tight diameter bound over-approximation for logic designs with intricate and/or complex feed-forward components with reconvergent fanout of varying delay paths. Specifically, an embodiment of the disclosure provides a method for determining an optimal diameter bound for evaluating complex feed-forward components within a netlist. The method includes a processor identifying from a netlist one or more strongly connected component(s) within the netlist, where a strongly connected component is a component that can fan out to itself. The method includes identifying acyclic registers in two or more input paths to a first strongly connected component from a first input, wherein each path has a different propagation delay; computing an additive diameter bound for the first complex feed-forward component; and computing a multiplicative diameter bound for the first complex feed-forward component. The method further includes determining a final additive diameter bound and computing a final multiplicative diameter bound for the subnetlist, then adding the final additive diameter bound to the final multiplicative diameter bound to generate a diameter bound over-approximation for utilization during bounded model checking of a subnetlist having the complex feed-forward component(s).

In the following detailed description of exemplary embodiments of the disclosure, specific exemplary embodiments in which the disclosure may be practiced are described in sufficient detail to enable those skilled in the art to practice the disclosure, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

It is understood that the use of specific component, device and/or parameter names (such as those of the executing utility/logic described herein) are for example only and not meant to imply any limitations on the disclosure. The disclosure may thus be implemented with different nomenclature/terminology utilized to describe the components/devices/parameters herein, without limitation. Each term utilized herein is to be given its broadest interpretation given the context in which that terms is utilized. The below paragraphs thus introduces certain terminology and concepts that is utilized within the descriptions of the various embodiments of the disclosure.

Throughout the description of the various embodiments of the disclosure, the presented logic representation format of the logic design being evaluated is defined in terms of a netlist. As provided herein, a netlist contains a directed graph with vertices representing gates, and edges representing interconnections between those gates. The gates have associated functions, such as constants, primary inputs, combinational logic, such as AND gates, simple sequential elements, and memory arrays. Within the following descriptions, primary inputs shall be interchangeably referred to as RANDOM gates, and simple sequential elements shall be interchangeably referred to as registers. Registers have two associated components: the register's next-state functions and the register's initial-value functions. Both components/functions are represented as other gates in the directed graph. Semantically, for a given register, the value appearing at the register's initial-value gate at time "0", which represents the "initialization" or "reset" time, will be applied as the value of the register itself. The value appearing at the register's next-state function gate at time "i" will be applied to the register itself at time "i+1". A "trace" is a sequence of Boolean valuations to the gates of a netlist over time, beginning at time 0. A "state" is a valuation to the registers of a netlist and refers to a cross-product of Boolean values to registers. A state which may be witnessed within 0 or more transitions from the initial states is referred to as a "reachable state". A "reachable state" is one reflecting a set of values which may be taken at some time "j" along some trace. The term "diameter" refers to the number of time-frames necessary to explore all states. That is, diameter refers to the minimal time "j" such that every reachable state is produced by time j along some trace.

Within the netlist, certain gates are labeled as "targets". In the described embodiments, targets correlate to the properties for which verification is desired, and the goal of the verification process is to find a way to drive logic "1" to a target node and to generate a trace illustrating this scenario if one is found, or to prove that no such assertion of the target is possible. According to one aspect addressed by the disclosure, if an over-approximation of the diameter is known to be j, and it can be demonstrated that a target may never be asserted within j time-frames along any trace, a conclusion can be made that the target cannot be asserted even along a deeper trace. One implementation of the diameter over-approximation technique can involve the following processes. First, the process characterizes the registers in the candidate or input netlist into four types: (1) constant registers, (2) table registers, (3) acyclic registers, and (4) complex registers. As defined, constant registers hold their initial states forever. Table registers refer to a set of registers where each register in a group of correlated table registers updates rather than holds the register's value atomically, via a process similar to a row in a two-dimensional memory array. Acyclic registers, which are the primary types of registers evaluated by the methods presented within the disclosure, are feed-forward registers and are described herein with reference to FIGS. 3A-3C. Complex registers then comprise all other registers. A further analysis of the utilization of this categorization scheme for registers to the novel functionality presented within the disclosure will provided after the description of FIG. 1 which follows.

FIG. 1 provides a block diagram representation of an example data processing system (DPS), within which the various computer-implemented methods of the disclosure along with the logic design of one or more candidate netlists can advantageously be implemented. DPS 100 sits within a DPS environment 150 that supports networking and/or other remote functionality of DPS 100. DPS 100 is configured to execute one or more analysis tools to analyze a logic design for correct operation, including specific tools and/or engines that enable the various aspects of the described embodiments.

DPS 100 can take various forms and can be represented as a workstations, laptop computer systems, notebook computer systems, desktop computer systems and/or clusters thereof. While not preferable due to processor size constraints and the high computational requirements of the computer-implemented algorithms presented in the various described embodiments, DPS 100 can also be a smaller processing system, such as a smart phone, tablet PC, and the like, without limitation. DPS 100 includes a processor 105 or central processing unit (CPU), which may include one or more processor cores for executing program code. Processor 105 is coupled to a system memory 110 via a system interconnect or system bus 107. Also connected to processor 105 via system bus 107 are storage 120, input/output (I/O) adapter/controller 130, and network interface device (NID) 140. Coupled to I/O adapter/controller 130 are one or more output devices, of which display 132 is provided as an example, and one or more input devices, of which mouse 134 and keyboard 136 are presented as examples. In one embodiment, storage 120 maintains a copy of one or more netlists 122 that can be evaluated using the techniques described herein. Storage 120 can also maintain a copy of Optimal Diameter Bounding Over-approximation (ODBO) tool 125, which represents a combination of the various algorithms and/or executable modules that can be loaded into system memory 110 prior to execution by processor 105 to implement the different functions presented herein.

Within the network environment 150, DPS 100 is communicatively connected via one or more wired or wireless networks 145, such as the Internet, to a server 152. Server 152 can be, for example, a tool server that facilitates download to DPS 100 of various analysis tools (e.g., verification, simulation, hardware acceleration, or synthesis tools), which for purposes of this disclosure shall be collectively referred to as ODBO tool 125. Server 152 can also be a netlist server from which one or more netlists 122 can be downloaded for analysis.

Loaded within system memory 110 are various executable program modules and/or software-coded algorithms, including, for example, operating system (OS) 112 of DPS 100, application programs 114 (e.g., a word processing application, a presentation application, and a netlist generation application). As shown, these program modules also comprise an example logic design embodied as candidate netlist(s) 116, and a copy of ODBO tool 125 specific to the disclosure. In one or more embodiments, ODBO tool(s) 125 can include, for example, verification, simulation, and/or synthesis tools. Each algorithm and/or function within ODBO tool(s) 125 can be an independent software module that executes on processor 105 to implement a specific set of diameter bounding computations and/or analyses and/or functions when applied to candidate netlist 116. In one embodiment, one or both of ODBO tool 125 and example netlist 116 can be loaded from storage 120 prior to execution by processor 105. In another embodiment, one or both of ODBO tools 125 and example netlist 116 can be downloaded from network server 152 or obtained from an input device, such as a flash drive insertably coupled to USB 139 or Compact Disk or Digital Video Device, coupled to and/or accessible via multimedia drive 138.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present disclosure. For example, other devices/components may be used in addition to or in place of the hardware depicted. The depicted example is not meant to imply architectural or other limitations with respect to the presently described embodiments and/or the general disclosure. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Certain aspects of the disclosure involves the execution on or by processor 105 of DPS 100 of various algorithms and/or program modules provided by OSBO tool 125 to yield results that can be outputted via one or more output mechanism, such as display 132. These algorithms are coded as modules for execution on processor 105 to evaluate and/or analyze candidate netlist 116, and the execution by processor 105 and/or DPS 100 of these algorithms provides a computer-implemented method for determining or computing a tight diameter bound over-approximation for logic designs with intricate and/or complex feed-forward components within a netlist. In one embodiment, the method includes the functions of: identifying from a netlist one or more strongly connected component within the netlist; identifying acyclic registers in two or more input paths to a first strongly connected component from a first input, wherein each path has a different propagation delay; computing an additive diameter bound for the first complex feed-forward component; computing a multiplicative diameter bound for the first complex feed-forward component; determining a final additive diameter bound and computing a final multiplicative diameter bound for the subnetlist; and adding the final additive diameter bound to the final multiplicative diameter bound to generate a diameter over-approximation for utilization during bounded model checking of a subnetlist having the complex feed-forward component(s).

Thus, generally, the disclosure provides a method and system for optimal diameter bounding of designs with complex feed-forward components. The method provides a mechanism to compute a tight diameter over approximation for intricate feed-forward components which involve re-convergent fan-out of differing delays. The computation includes: efficiently identify re-convergent sub-circuits that may require special consideration in diameter bounding; tightly alter additive components of diameter bounding; and tightly altering multiplicative components of diameter bounding.

As presented herein, the primary aspects of the disclosure include: (1) a method to efficiently identify reconvergent sub-circuits that may require special consideration in diameter bounding; (2) a method to tightly alter "additive" components of diameter bounding; and (3) a method to tightly alter "multiplicative" components of diameter bounding. The overarching aspect then provides (4) a method to compute a tight diameter bound by summing the results of the second and third methods. Implementation of these various aspects of the disclosure is provided with reference to the flow charts, described below, and FIG. 2, which is now described.

Figure 2:
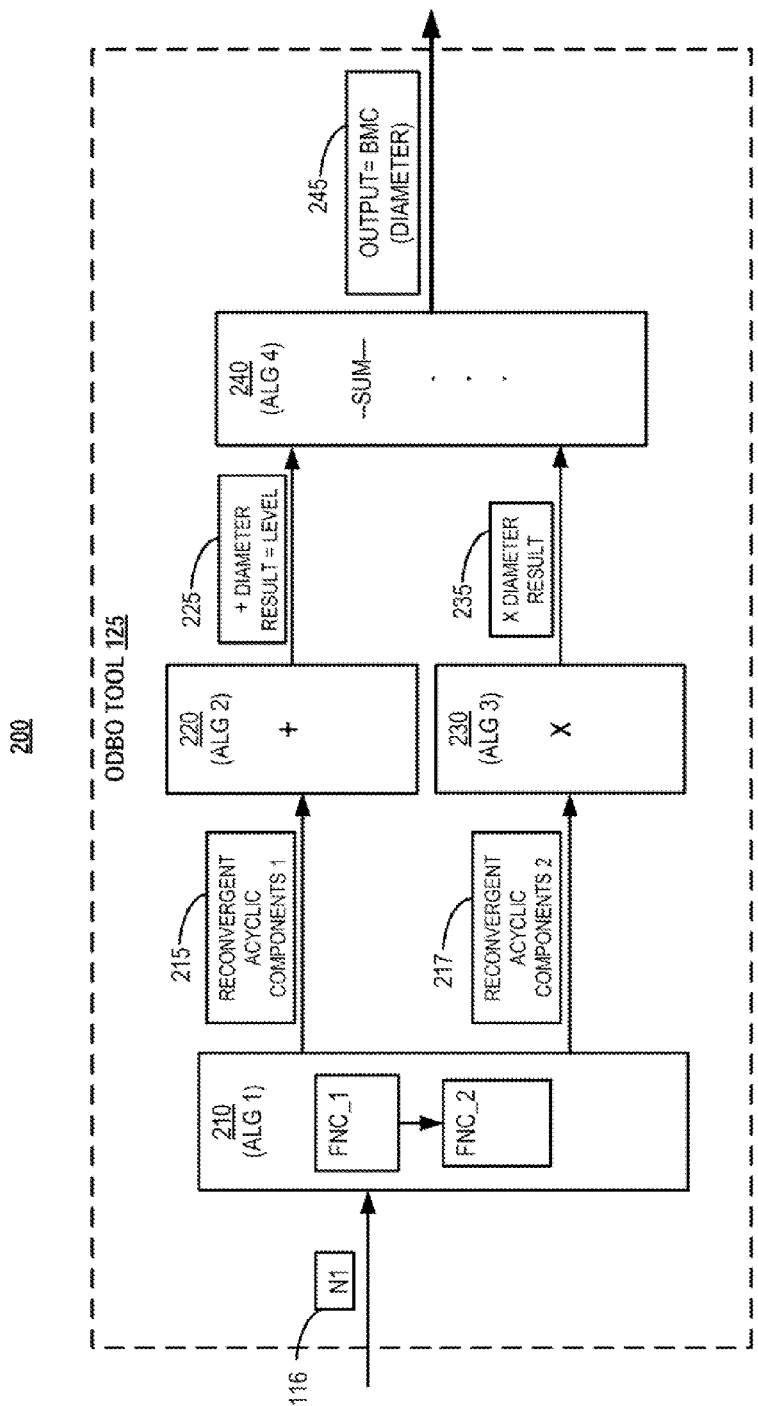
FIG. 2 illustrates a block diagram representation of functional modules of an Optimal Diameter Bounding Over-approximation (ODBO) tool within a multi-algorithm framework that implements the functions associated with one or more computer-implementable methods for diameter bounding over-approximation, according to one or more embodiments.

FIG. 2 provides a sequence diagram of multi-algorithm framework 200. Multi-algorithm abstraction framework 200 includes a sequence of four computer-executable program modules, each representing executable code of one of the four algorithms described herein as being generally provided within ODBO tool 125. ODBO tool 125 includes first abstraction module 210, which comprises algorithm 1, second module 220, containing algorithm 2, third module 230, containing algorithm 3, and fourth module 240, containing algorithm 4. Illustrated within multi-algorithm framework 200 are directional links established between the various modules indicating the directional flow of processing from one algorithm to the next algorithm. Illustrated with each intermediate left-to-right directional link is a set of output-input parameters being generated by the module to the left of the arrow and passed as an input to the module at the right of the arrow. ODBO tool 125 receives an input of candidate netlist (N1) 116 and generates a final output of an optimal diameter bound over-approximation 245. The functionality of each module is described herein with respect to the specific algorithms and the inputs provided to those algorithms. Each algorithm is presented in the disclosure as both pseudo-code as well as a corresponding method process illustrated by one of the flow charts. As defined herein, algorithm 1 is an algorithm utilized to detect and/or identify each complex-feed forward component that is a reconvergent fanout component or register, with differing delays on multiple paths from a common or single input. These complex feed-forward components, referred to as reconvergent acyclic components 1 215 and reconvergent acyclic components 2 217, are indicated as the outputs from first module 210 and the respective inputs to second module 220 and third module 230. According to one or more embodiments, both second module 220 and third module 230 receive an input of each of the acyclic components identified at first module 210, and thus, reconvergent acyclic components 1 215 includes all of the inputs provided within reconvergent acyclic components 2 217. Each acyclic component is therefore passed both to the additive algorithm as well as the multiplicative algorithm to assess the impact, if any, of that acyclic component on the overall diameter. Algorithm 2 provides an additive diameter computation for each identified complex feed-forward component, with equal numbers of inversions along the reconvergent paths, i.e., reconvergent acyclic components 1 215. Algorithm 3 provides a multiplicative diameter computation for each identified complex feed-forward component, with different number of inversions along the reconvergent paths, i.e., reconvergent acyclic components 2 217. Each of algorithm 2 and algorithm 3 generates a respective output, illustrated as summation diameter results 225 and multiplicative diameter result 235. These two outputs of second module 220 and third module 230 are then provided as the inputs to fourth module 240 and specifically algorithm 4. Algorithm 4 provides a summation algorithm that generates a sum of the final additive diameter bound (225) and the final multiplicative diameter bound (235) which can be also be generated as outputs from algorithm 2 and algorithm 3, respectively in an alternate embodiment. The final additive diameter bound is then added to the final multiplicative diameter bound.

Within the netlist, the cyclic components of the netlist also have a cyclic additive diameter and/or a cyclic multiplicative diameter. According to one aspect of the disclosure, the final resulting diameter over-approximation includes consideration of the additive and multiplicative diameters of, or within, the cyclic components fed by the reconvergent fanins. The diameters of these cyclic components can be computed using any available methodology, and the computation therefore occurs concurrently with or in addition to the evaluation, utilizing the methodology described herein, of the diameters of the complex acyclic components. Once both sets of diameters (i.e., cyclic and acyclic) are determined and/or computed for both cyclic and acyclic components, a final additive diameter and/or a final multiplicative diameter, as well as the overall final diameter bound of the netlist can be determined. As described below with reference to FIG. 7 and algorithm 4, the determination of the final multiplicative diameter involves multiplying the acyclic multiplicative diameter with the cyclic multiplicative diameter, and the determination of the final additive diameter involves adding the acyclic additive diameter with the cyclic additive diameter, and the determination of the tight diameter bound over-approximation involves adding the result of the final multiplicative diameter to the result of the final additive diameter. Thus, ODBO tool 125 and specifically first module 210 receives an initial input that includes candidate netlist 116 (FIG. 1) and ODBO tool 125 generates an output of a tight diameter bound over-approximation for candidate netlist 116.

One important preliminary evaluation of algorithm 1 is the identification of complex-feed forward components. Performing this operation requires an expressed categorization of the different types of registers within the netlist. According to one embodiment, and as described with reference to the flow chart of FIG. 4, this categorization of registers is completed by searching within the input/candidate netlist for "strongly connected components" and "complex-feed forward components." As provided herein, strongly connected components are sets of registers and gates in a netlist which can fan out to themselves, i.e., within an SCC, any gate in that SCC may fan out to itself and/or any gate can fan in to itself. Complex-feed forward components represent acyclic components within the netlist that have reconvergence, i.e., there are two (2) or more distinct paths that feed from a same input to the acyclic component or gate.

Beginning with the above introduced four types of registers, i.e., (1) constant registers, (2) table registers, (3) acyclic registers, and (4) complex registers, the registers that can be categorized as table registers versus complex registers can be so categorized by analyzing whether the register's next-state functions constitutes an acyclic update versus a cyclic hold pattern. If the register's next-state functions constitute an acyclic update pattern, the register is a table registers. Otherwise, if the register's next-state function is the register itself, which means that the register cannot change values over time, the register is categorized as constant. Constant registers are in singleton-gate strongly connected components, consisting only of themselves. Otherwise, if the register is in a strongly connected component, the register is categorized as a complex register. The registers that are not in a strongly connected component are considered acyclic registers. Complex registers entail an exponential diameter bound with respect to their count since, in the worst case, the complex registers can act as counters. However, tighter diameter bounds can be achieved for the other types of registers. In determining the diameter bounds with a sub-netlist that includes these other types of registers, the following considerations can be applied: (1) constant registers do not increase the diameter; (2) acyclic registers only increase diameter by a linear contribution equal to the number of acyclic registers that may be encountered on a path from a target fanin-wise to the inputs; and (3) table registers increase diameter multiplicatively with respect to the complex register diameter. With the third consideration, however, the multiple is a factor of the number of distinct correlated rows of registers rather than being exponential in the cardinality of such sets, where a correlated row of registers are table registers which exhibit their acyclic update under identical scenarios.

As introduced above, aspects of the present disclosure introduce a method and system to compute tight diameter bounds for feed-forward design components, i.e., those comprised solely of acyclic registers. Within the disclosure, feed-forward refers to a design where logical values flow in only a single direction, which is commonly the case in pipelined designs. The disclosure provides a tool, ODBO tool 125, to compute a tight diameter over-approximation for intricate feed-forward components which involve reconvergent fanout, i.e., where there are multiple distinct paths involving the same starting and ending components, of differing delays. A previous methodology for performing diameter bound over-approximation analyses can evaluate only simple netlist designs that do not involve complex feed-forward components, i.e. those paths with reconvergent fanout that may entail, for example, multiple paths from a RANDOM gate to a strongly connected component, where the paths pass through a different number of acyclic registers. This prior methodology is only generally applicable to acyclic components where every path from a given input to another design component pass through the same number of registers, i.e., where each such path has the same "delay". However, this simple configuration of components having a same delay path is generally not the case. Aspects of the disclosure thus provide a solution that is scalable and can be utilized with these complex and/or intricate netlist designs to yield a tight over-approximation diameter bound on the evaluated netlist structure. Specifically, implementation of the disclosure enables tight diameter bounding of acyclic registers, where the different paths from a target to a particular input can traverse through a differing number of registers.

Figure 3A:
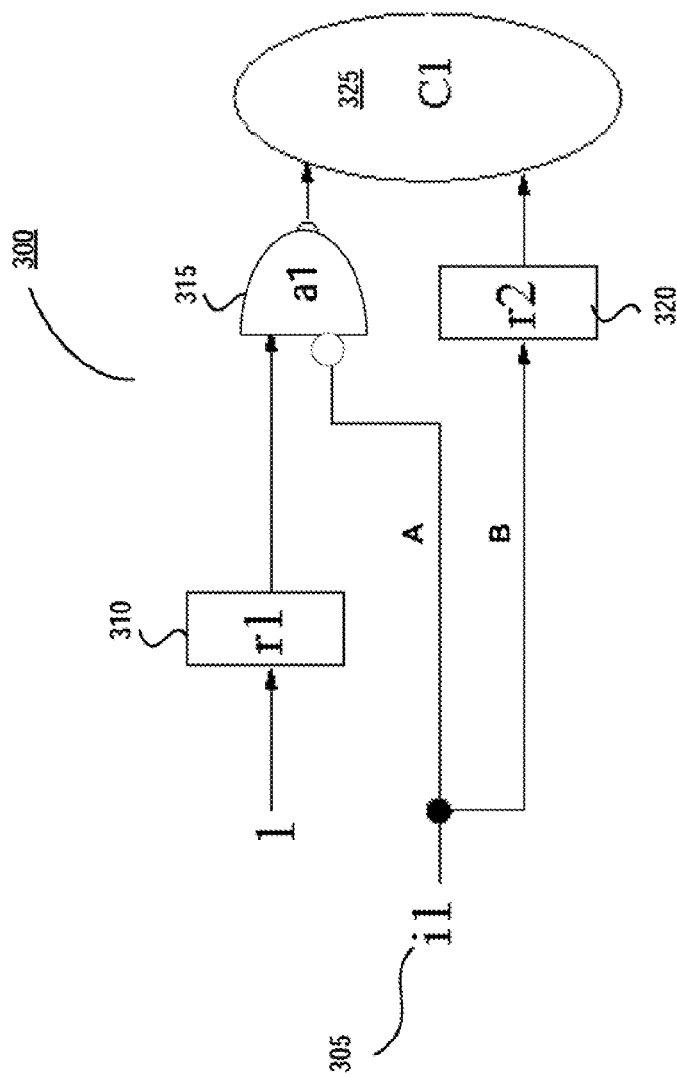
FIGS. 3A-3B illustrate two examples of reconvergent fanins to a complex feed-forward component with a different depth along the two propagation paths from the input, according to one or more embodiments.
Figure 3B:
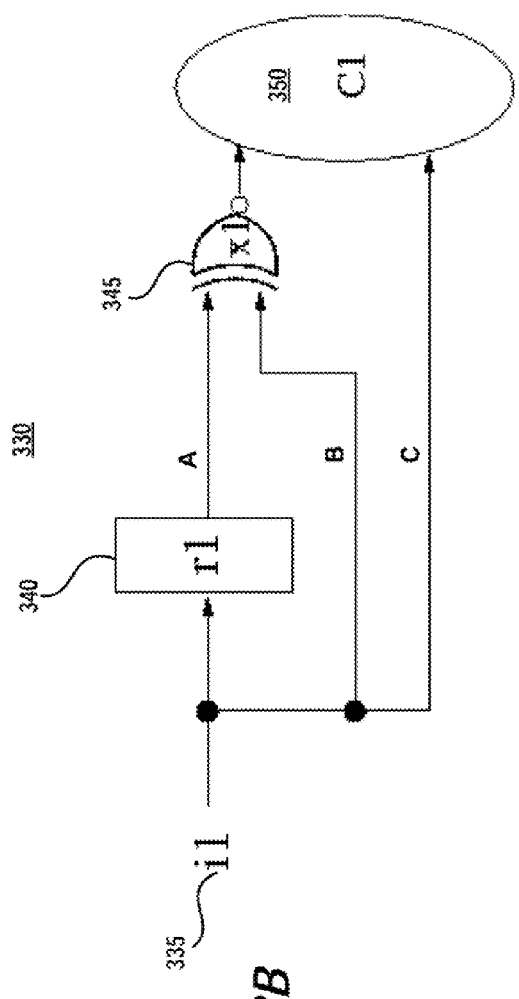
Figure 3C:
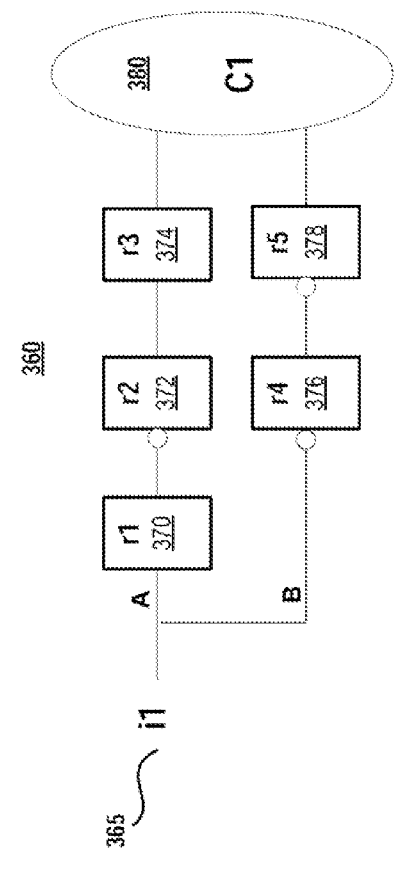
FIG. 3C illustrates an example of fan-ins to a complex feed-forward component with acyclic registers having different number of inversions along the different propagation paths, according to one embodiments.

FIGS. 3A-3C provides three simple illustrations of the types of acyclic registers that can be advantageously evaluated utilizing the ODBO tool 125 of the present disclosure. It is again noteworthy that the existing methodology cannot perform an evaluation of a tight diameter bound for these types of register configurations due to the differing delays along the multiple reconvergent paths from the inputs to strongly connected components. For each figure, the strongly connected component, C1, is assumed to be a cyclic circuitry that has its own diameter value, e.g. exponential in its register count. The cyclic components are described as a circuitry in which any gate can be reached from another gate within the component via either fanout or fanin traversals. As presented within FIG. 8, described below, one aspect of the disclosure may take the specific case where each C1 has a diameter value of 4, which is utilized when calculating the additive and the multiplicative portions of the overall diameter over-approximation of the particular subnetlist. FIG. 3A illustrates additive diameter increases through unate reconvergent fanout of differing delays. As shown, a first netlist 300 which has a single input "i1" 305, and two registers "r1" 310 and "r2" 320 leading to an arbitrary design component "C1" 325 along different paths. First netlist also has an exclusive NAND gate, a1 315, receiving inputs from i1 305 and r1 310, and forwarding its output to C1 325. There are two paths from input i1 305 to C1 325: a first path labeled "A" providing a connection through a1 315 and a second path labeled "B" providing a connection through r2 320 on the bottom. A NAND gate will output a logical "1" value if and only if either input takes value 0. Thus, if the initial value of r1 310 is 0, then a1 315 will output value 1 at time 0 only if i1 305 takes value 0 at time 0. If this condition occurs (i.e., i1=0 at t0), then the value at r2 320 will be 0 at time 1 (t1). Assuming that the initial value of r2 320 is 0, this would indicate that the earliest that value 1 can appear at both inputs to C1 325 is at time 2 (t2). In contrast, if the path from i1 305 to a1 315 did not exist (i.e., if a different input i2—not shown—drove r2 320), then value 1 may appear at both inputs to C1 325 at time 1.

The example of FIG. 3A illustrates how reconvergent fanout of differing delays between an input and another component can cause increases in diameter. In effect, the propagation of initial values through acyclic registers can constrain values on inputs involved in reconvergences to achieve certain valuations, which can propagate and impact other valuations along other paths. Fortunately, if such reconvergence is "unate", i.e., there is only an even or odd number of inversions encountered within all such paths involved in a particular input-to-component reconvergence, these constraints may only persist for an "additive" number of time-frames with respect to the differing delays along the reconvergence.

FIGS. 3B and 3C illustrate how multiplicative increases can arise through "binate" reconvergence. With binate reconvergence, some paths from a given input to a component have an even number of inversions and others have an odd number. The example netlist 330 of FIG. 3B has one input, i1 335, which drives exclusive NOR gate, x1 345, inverted due to the NOR, as well as a delayed version through register r1 340 which drives x1 345 similarly inverted. The output of a1 345 connects to C1350. Netlist 330 also has a third part connecting directly to C1 350 uninverted. Effectively, the output of a1 345 acts as a "falling edge detector" over input i1 335, and thus this input may evaluate to 1 no more frequently than at every other time-frame. Unlike the unate example of FIG. 3A where the valuation constraints disappear after a linear number of time-frames, this constraint persists indefinitely and therefore causes a multiplicative increase in diameter.

The example netlist 360 of FIG. 3C also triggers a multiplicative diameter increase due to binate reconvergent fanout of differing delays. Netlist 360 has one input i1 365 which feeds through two paths of registers having a different number of inversions to C1380. First path A provides r1 370, r2 372, and r3 374, with the input to r2 372 inverted. Second path B includes r4 376 and r5 378. The inputs of both r4 376 and r5 378 are inverted. Thus, first path A has an odd number of inversions, while second path B has an even number of inversions, which represents binate reconvergent fanout and triggers a multiplicative diameter increase.

Figure 4A:
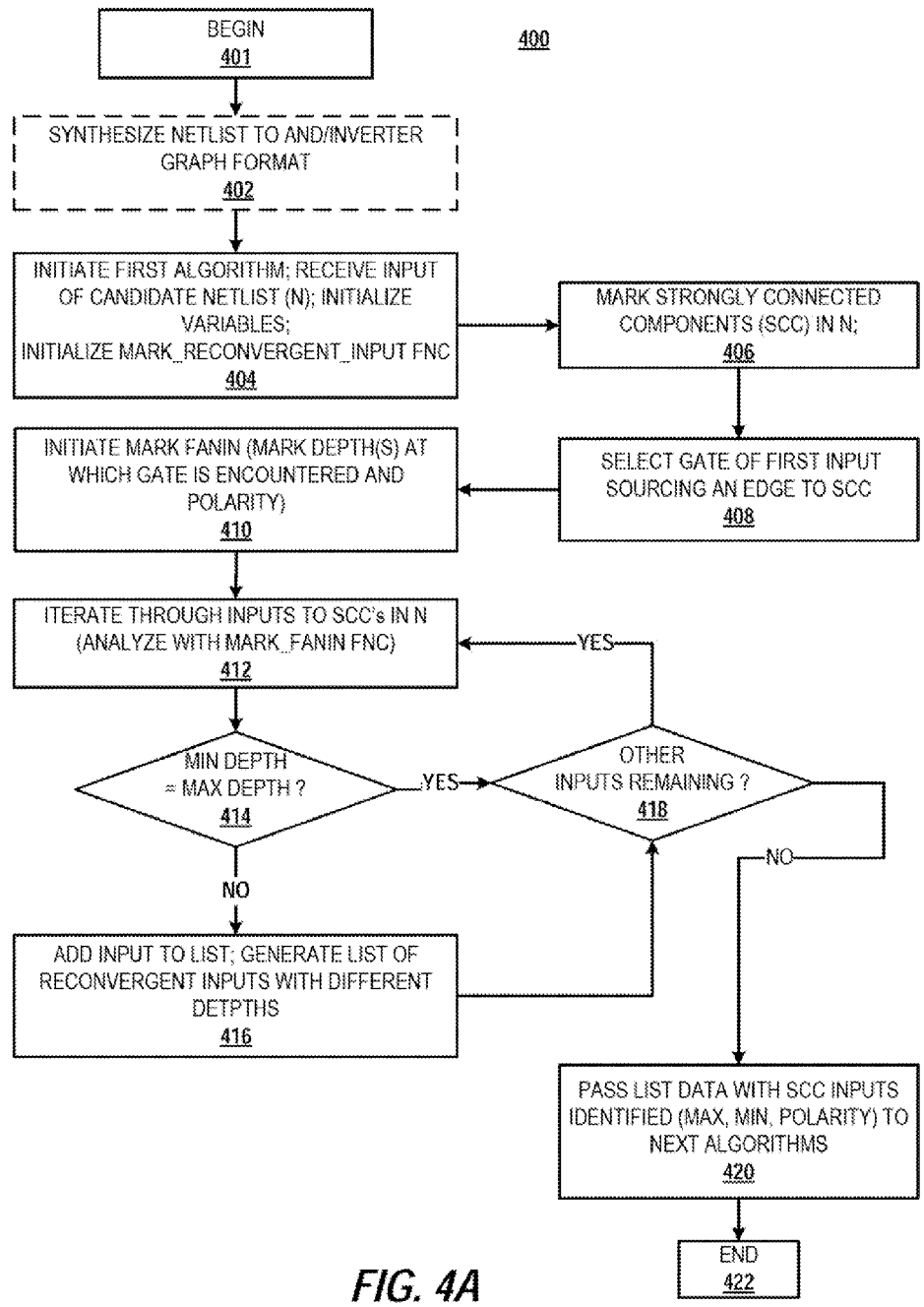
FIG. 4A is a flow chart illustrating a computer-implementable method for identifying complex feed-forward components with reconvergent input paths of differing depths, according to one embodiment.
Figure 4B:
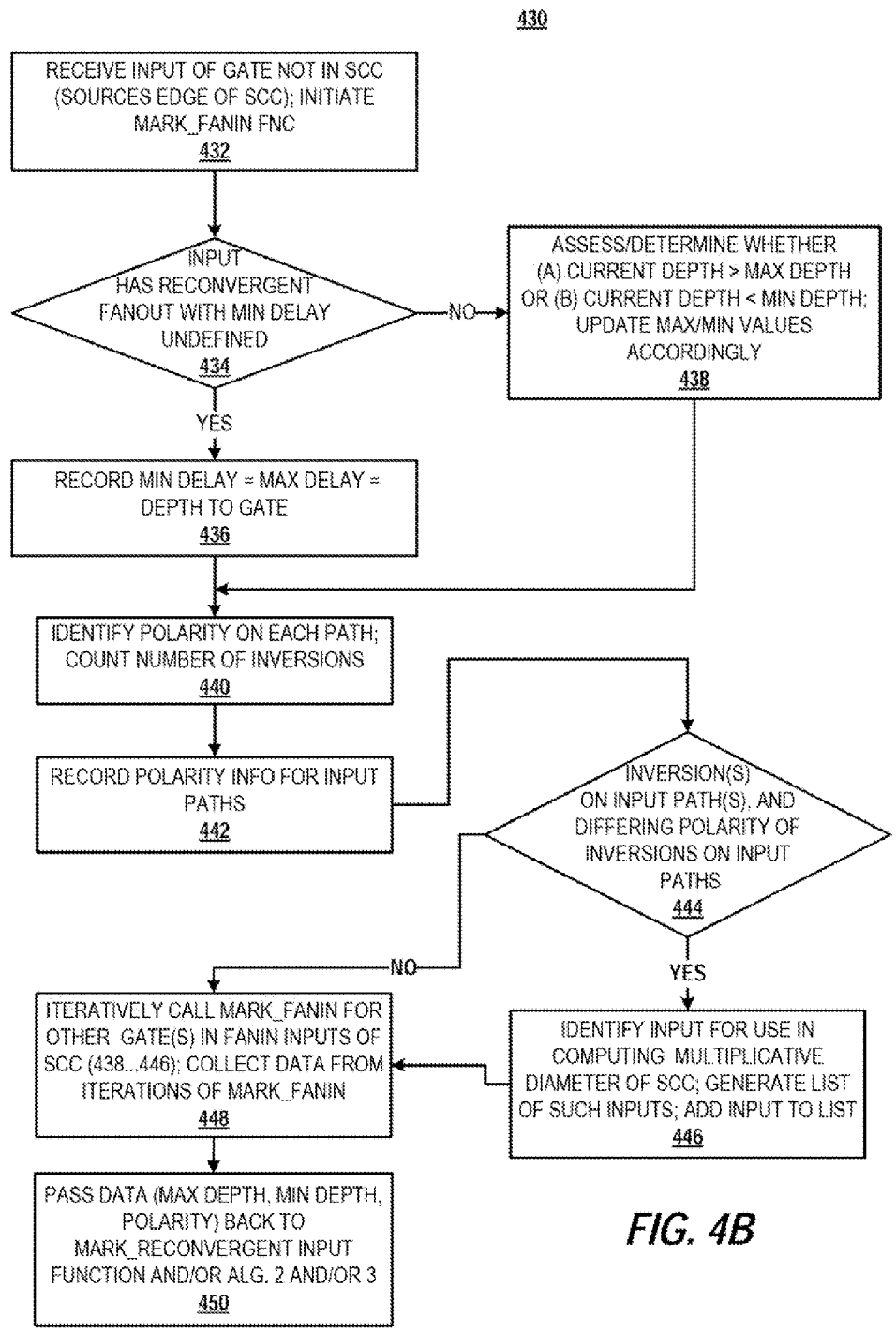
FIG. 4B is a flow chart illustrating a computer-implementable method for implementing a mark_fanin function to identify depths and polarities of gates within the reconvergent input paths, according to one embodiment.

Referring now to FIGS. 4A and 4B, with reference also to ODBO tool 125 of FIG. 2, a first aspect of the disclosure includes an efficient method to identify reconvergent fanout paths, such as those described with reference to FIGS. 3A-3C, which can cause diameter bounding increases. Algorithm 1 provided by first module 210 is executed by a processing device and particularly processor 105 of DPS 100 to perform this initial process. Algorithm 1 consists of two functions: function mark_reconvergent_inputs(Netlist N), where Netlist N represents candidate netlist 116, and function mark_fanin. The first function "mark_reconvergent_inputs" identifies strongly connected components in the netlist. This first function is represented within the flow chart of FIG. 4A described below. According to one embodiment, this first function can be performed efficiently in linear-time. The first function, mark_reconvergent_inputs (illustrated as FNC_1 in first module 210) then calls the second function, mark_fanin (illustrated as FNC_2 in first module 210) on each gate sourcing an input edge to a strongly connected component. The second function is represented within the flow chart of FIG. 4B, which is also described below.

One embodiment of the disclosure involves an assumption within algorithm 1 that the netlist (candidate netlist 116) has been synthesized to an "And/Inverter Graph" format where the only combinational logic gates are AND gates and inversions are implicit as edge attributes. This synthesis of the netlist is relevant because function mark_fanin tracks whether an even or odd number of inversions have been passed through via the Boolean argument. According to one embodiment, extending algorithm 1 to higher-level netlist formats can be relatively straight-forward by keeping track of (a) the type of a gate when performing this traversal and (b) whether a synthesis to an And/Inverter Graph would entail an inversion on the input or output of the higher-level gates.

According to one embodiment, algorithm 1 can be implemented in linear time with respect to the netlist size. The pseudo code of algorithm 1 is provided below and is described thereafter with reference to the flow charts of FIGS. 4A and 4B. Within the presented pseudo codes, each separate line of pseudo-code and/or comments is referenced in numerical order by a leading reference number, beginning with a first line numbered 1 and increasing sequentially. Also, the algorithm is separated into the two functions within the below pseudo code.

function mark_reconvergent_inputs(Netlist N)
    1. for each gate G in N
    2.                  G.min_delay=G.max_delay=undefined; G.inverted=G.uninverted=false // initialize global variables
    3. Mark strongly connected components of N
    4. for each strongly connected component S of N
    5. for each gate G sourcing an edge E to S
    6. mark_fanin(G, 1, is_inverted(E)) // identify min and max depths to gates, as well as polarity
    7. for each input I of N
    8. if NOT(I.min_delay==I.max_delay)
    9. Push I onto "list" // identify reconvergent inputs
    10. Return list
    function mark_fanin(gate D, integer depth, boolean inverted)
    11. if(G is in a strongly connected component) return
    12. if(G.min_delay==undefined)
    13. G.min_delay=G.max_delay=depth
    14. else
    15. if(G.min_delay>depth)
    16. G.min_delay=depth
    17. else if(G.max_delay<depth)
    18. G.max_delay=depth
    19. else if((inverted AND G.inverted) OR (NOT(inverted) AND G uninverted)) return
    20. G uninverted=G uninverted OR NOT(inverted)
    21. G.inverted=G.inverted OR inverted
    22. for each gate G2 sourcing an edge E to G
    23. mark_fanin(G2, depth+is_register(G)?1:0, inverted XOR is_inverted(E))

When program code from first module 210 is executed by processor, the program code causes processor to complete a computer-implemented method provided by algorithm 1 following receipt of a candidate netlist 116 as an input to first module 210 encompassing algorithm 1. As introduced above, algorithm 1 provides two functions, a mark_reconvergent_input function, with functionality illustrated by the method 400 of FIG. 4A, and mark_fanin function, having functionality partially illustrated by the method 430 of FIG. 4B. Referring to FIG. 4A, method 400 that implements aspects of the first function begins at block 401 and proceeds to block 402 at which method 400 synthesizes the netlist to generate an AND/Inverter graph format. This synthesis function is presented within a dashed block to indicate that the function is optional and can, in some embodiments, be completed prior to implementation of the core functions of algorithm 1 and thus omitted from the description thereof. Method 400 then receives candidate netlist (N) and initiates function mark_reconvergent_inputs on candidate netlist 116 (block 404). Within this function, method iteratively passes through each gate of netlist 116 to identify strongly connected components (block 406). Method 400 selects a gate of netlist that sources an edge of a strongly connected (cyclic) component (block 408). Method 400 initiates the mark_fanin function, which marks the depth at which the selected gate is encountered as well as the polarity of each path of the fanin (block 410). Method then iterates over each input to a strongly connected component in the netlist (block 412) and determines for that input whether the minimum depth of the fanin is equal to the maximum depth (block 414). When the minimum and maximum depths are not equal, method 400 adds the input to the list of reconvergent inputs with different depths (block 416). In this way, method generates a list of reconvergent inputs with differing depths along the various paths to the strongly connected components. Method 400 then determines at block 418 if there are any other inputs remaining to be analyzed, and method continues to iterate through the inputs when there are additional inputs remaining However, in response to there not being any additional inputs to analyze, at block 420, method 400 passes (or outputs) the generated list of data indicating which inputs to strongly connected components have reconvergence with different maximum and minimum depths to modules 2 220 and module 3 230 of ODBO tool 125 (FIG. 2). Following the analyses of all gates and inputs of netlist, method 400 ends at termination block 422.

Referring to FIG. 4B, responsive to method 400 of FIG. 4A calling the mark_fanin function with a selected gate that sources an edge of a strongly connected component (SCC), method 430 implements aspects of the second function. Specifically, method 430 begins at block 432 at which mark_fanin function is initiated in response to receiving an input of the selected gate that is not in an SCC. For clarity, references to functions performed by method 430 can be interchangeably described as functions performed by the mark_fanin function. As a first aspect of mark_fanin, method 430 determines when a selected input of the netlist has a reconvergent fanout traversing reconvergent fanout paths of differing register counts to a strongly connected component. As shown, method 430 determines at block 434 whether the selected input of the netlist has a reconvergent fanout with the minimum delay undefined. When the minimum delay is undefined, i.e., the selected input is not along a reconvergent fanout with differing register counts to a strongly connected component, mark_fanin initially records a result indicating that the minimum delay and the maximum delay are equal to each other and specifically equal to the current depth at which mark_fanin has been called for the current gate (block 436). It is noteworthy that this initially recorded result may be overwritten by subsequent calls to mark_fanin along paths with differing depth and/or inversion polarity.

At decision block 434, in response to the input to the identified strongly connected component having a reconvergent fanout with a defined minimum delay, method 400 assesses whether the current depth at which mark_fanin has been called for the current gate is greater than the maximum depth defined for the current gate, or less than the minimum depth defined for the current gate, and method 400 updates the corresponding values of maximum and minimum delay/depth accordingly (block 438).

Within algorithm 1, function mark_fanin is responsible for marking the minimum and maximum number of registers encountered in series during the course of the computation of mark_reconvergent_inputs. In one implementation, function mark_fanin can perform this operation via "min_depth" and "max_depth" attributes on a per-gate basis, respectively. Additionally, function mark_fanin keeps track of whether a given gate was encountered in positive (uninverted) or negative (inverted) polarity. With reference to the pseudocode of algorithm 1, when function mark_fanin first encounters a gate (lines 12-13), function mark_fanin will mark the depth at which the gate was encountered. As indicated by line 23 of the pseudo code, when the function is traversing through a register, the "depth" argument is incremented. Furthermore, function mark_fanin will mark the polarity with which the function encountered that gate, as provided at lines 20-21 of the pseudo code. Thereafter, function mark_fanin will only re-traverse acyclic gates if function mark_fanin encounters those gates with a greater (lines 15-16 of pseudo code) or lesser (lines 17-18) depth than previously determined, or with a new polarity (i.e., line 19 when evaluating to false). Finally, lines 7-9 of the pseudo code identifies inputs encountered with differing depths and returns a list of such inputs on line 10.

According to one embodiment, mark_fanin analyzes each gate that is not part of a strongly connected component, i.e., an acyclic gate, and determines whether the acyclic gate has a different depth and/or a different polarity than was previous determined for another gate within the reconvergent input paths. In response to the gate having a different depth and/or polarity, mark_fanin determines the actual depth and polarity of the gate by traversing the path to the gate to determine the maximum depth. The mark_fanin function thus iterates through each of the gates in the fanin of the strongly connected component inputs, and evaluates the maximum and minimum depths for those gates that have a different depth or polarity than previously determined. When all the gates have been analyzed, markfanin function (i.e., method 430) passes the collected data for each reconvergent input as the output of the mark_fanin function.

Returning to the flow chart, concurrently with or in sequence with the determination of the maximum and minimum depths of each input to the strongly connected components, method 400 further implements a second aspect of the mark_fanin function, which identifies/checks/tracks and records the number of inversions along each path of the reconvergent fanins associated with each strongly connected component (block 440). As presented herein, the resulting polarity of the number of inversions are the same when both divergent paths have an odd number of inversions or when both divergent paths have an even number of inversions. Method 430 records the polarity information (i.e., the number of inversions for the input path(s)) (block 442). Method 430 determines at block 444 whether there is a different polarity of inversions on the different input paths (e.g., there are an even number of such inversions on one or more of the reconvergent input paths to the SCC and an odd number of such inversions on one or more of the other reconvergent input path(s) to the SCC). According to one or more embodiment, zero is considered an even number such that an input path having no inversions is considered as having an even number of inversions. In response to there being different polarities of inversions on the input paths to the SCC, method 430 identifies/marks the input as being relevant to the computation of the multiplicative diameter and adds the input to the list of inputs that should be utilized in computing/calculating the multiplicative diameter for that SCC (block 446). Method 430 then iteratively applies the mark_fanin functions of blocks 438 . . . 446 to the other gates in the fanin inputs of the strongly connected component and collects the resulting data from the iterations (block 448). Method 400 then passes the collected data from the mark_fanin function back to the mark_reconvergent_input function and/or to the second and third algorithm (block 450).

In one implementation, method 430 determines whether the fanin input to the SCC provides a binate function by identifying a polarity of each input path to the SCC. The polarity is identified by recording a number of inversions along each path of the reconvergent fanin, and the polarity identifies one of (a) no inversions, (b) a same even or odd polarity of inversions on each of the reconvergent input paths, and (c) a different polarity of inversions on the reconvergent input paths. A resulting polarity of a number of inversions is the same in response to both reconvergent paths having an odd number of inversions or both reconvergent paths having an even number of inversions. Then, in response to the number of inversions indicating a different polarity on the reconvergent input paths to the SCC, method 430 records polarity information for the SCC and identifies the SCC as requiring computation of the multiplicative diameter.

According to one embodiment, all inputs to SCCs with different depths are passed to algorithm 2, while only those inputs with both even and odd inversion polarities are passed to algorithm 3. Method 430 forwards the data related to the list of all inputs with different depths (i.e., reconvergent acyclic components data 1 215, FIG. 2) to the second module 220 for processing by algorithm 2. Additionally, in response to the polarity of the number of inversions being different, method 400 forwards the data related to the list of inputs with different polarities (i.e., reconvergent acyclic components data 2 217) to the third module 230 for processing by algorithm 3.

Figure 5:
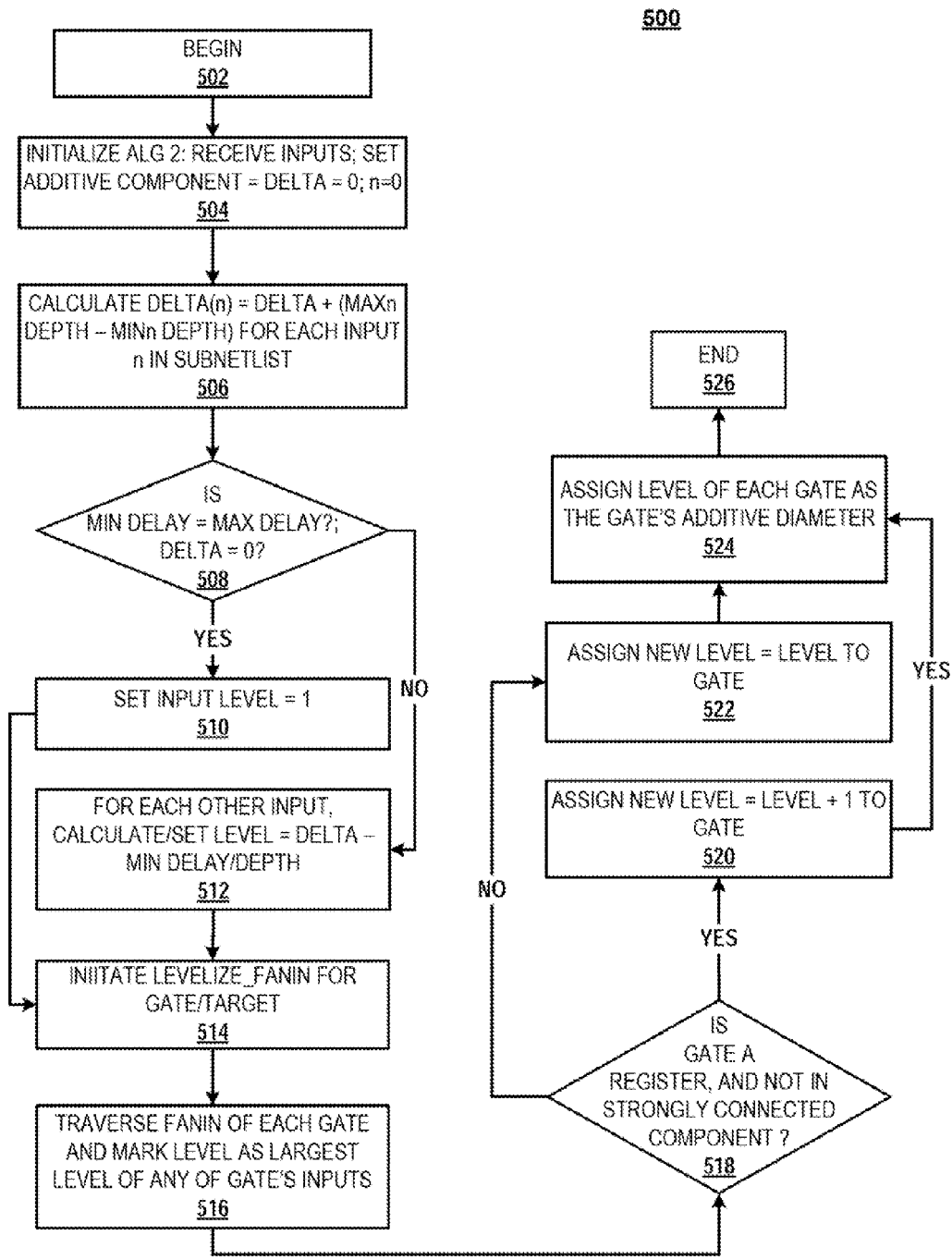
FIG. 5 is a flow chart of a first computer-implementable method for performing additive diameter boundary computation for complex feed-forward components with reconvergent input paths of differing depths, according to one embodiment.

FIG. 5 provides a flow chart of a method 500 generated when program code within second module 220 of ODBO tool 125 is executed by processor 105 of DPS 100. Module 2 220 provides code for implementing algorithm 2, which provides the functionality of a method to tightly overapproximate the additive component of diameter bounding. The pseudo code of algorithm2 is now presented, and the functions are described with reference to the method presented by FIG. 5. As with algorithm 1, two functions are identified within algorithm 2, function compute_additive_diameter(Netlist N) and function levelize_fanin(gate G). Segmentation of the algorithm into the two functions is presented within the below pseudo code.

function compute_additive_diameter(Netlist N)
    1. list=function mark_reconvergent_inputs(N)
    2. delta=0
    3. for each input I in list
    4. delta=delta+(I.max_depth−I.min_depth)
    5. for each gate G in N
    6. G.level=undefined
    7. for each input I in N
    8. if (N has no strongly connected components OR (I.min_depth==I.max_depth))
    9. I.level=1
    10. else
    11. new_level=delta−I.min_depth
    12. I.level=new_level>=0 ? new_level+1:1
    13. foreach target T in N
    14. levelize_fanin(T) // T.level is the diameter of T
    function levelize_fanin(gate G)
    15. if (G.level !=undefined) return
    16. G.level=in_progress
    17. new_level=0
    18. for each gate G2 sourcing an edge E to G
    19. levelize_fanin(G2)
    20. if (G2.level>new_level)
    21. new_level=G.level
    22. if (G3 is a register not in a strongly connected component)
    23. new_level=new_level+1
    24. G.level=new_level //compute_additive_diameter (N)

The computer-implemented method of FIG. 5 provides the functions coded by algorithm 2 and begins at block 502. Method 500 then proceeds to block 504 at which processor 105 initializes algorithm 2 in response to receiving input(s) of reconvergent acyclic components data 1 215 within one or more subnetlists generated and/or indentified by algorithm 1. As utilized herein, a subnetlist refers to a set of inputs and gates corresponding to those in the fanin of a single target under observation. Candidate netlist 116 can comprise a plurality of subnetlists. These subnetlists can be separated out in order to analyze the diameter bound for that particular subnetlist separate from the diameter bound of other subnetlists and/or the candidate netlist 116. As provided above within the description of FIG. 4B, the input components (215) to algorithm 2 for strongly connected components can have different delay paths. Initialization of the function includes setting the value of "delta" parameter to 0 and count parameter (n) to 0. According to one embodiment, rather than receiving the input automatically when generated as outputs from algorithm 1, algorithm 2 can first make a call to function mark_reconvergent_inputs from algorithm 1 to identify inputs which have reconvergent fanout of differing delay.

With the inputs received for algorithm 2, method 500 selects each input n and calculates the value of delta for that input as the difference between the maximum delay and the minimum delays values on the reconvergent paths associated with input n (block 506). This process is provided by lines 3-4 of algorithm 2. Method 500 then determines at block 508 whether the maximum delay path was equal in value to the minimum delay path, i.e., whether the delta value for the input equals zero. In response to the minimum delay and maximum delay being equal and/or the delta value being equal to zero, method 500 sets the level of the input to 1 (block 510). However, in response to the value of delta not being equal to zero, method 500 calculates the difference between delta and the minimum delay of that input and sets the level of that input to the result of the calculation (block 512). This seeding of the inputs with a level corresponds to lines 7-12 of algorithm 2. According to one aspect, if the netlist has no strongly connected components, no special treatment of inputs with reconvergent fanout is necessary. In fact, if there are no strongly connected components, Algorithm 1 would not have identified any inputs with differing depth, rendering algorithm 2 unnecessary. Thus, once method 500 determines at block 510 that there are no inputs having reconvergent fanout of differing delays, method 500 automatically seeds the input at level 1 (see lines 8-9 of algorithm 2).

With each input level established, method 500 initiates the function levelize_fanin to compute the additive diameter of each target (block 514). The levelize_fanin function recursively traverses the fanin of each gate, marking the level of each gate as the largest level of any of its inputs (block 516). The levelize_fanin function determines at block 518 whether a gate is a register, and not within a strongly connected component. Method 500 assigns the same level to all gates within a strongly connected component. Thus, in response to the encountered gate being a register that is within the strongly connected component, method 500 does not increment the largest level of any of the gate's inputs, and method 500 simply assigns the level to the gate as the new level (block 522). Similarly, method 500 does not increment the largest level of inputs for gates which are not registers. However, in response to the gate being a register that is not within a strongly connected component, method 500 increments the level when passing through an acyclic register and assigns a value of the level to the gate incremented by 1 as the new level (block 520). Method 500 then assigns the level of each gate as the additive diameter of that gate (block 524). Method 500 then ends at block 526.

According to the above description, in calculating the additive diameter, the method 400 traverses through each path of the acyclic pipeline stages and counts the number of registers. A maximum count is then identified as well as a minimum count. If these paths have different delays (i.e., with recovergent fanout of different depths), the value of the maximum and minimum count will be different. Thus for example, with FIG. 3A, because the r2 registers adds a 1 step clock delay to the second path B for an evaluation of the subnetlist to trigger all reachable behaviors, the determination of the diameter requires inclusion of an additional 1 step increment in the diameter in order to account for this delay. First, a value of delta is computed for the sub-circuit in the fanin of C1, which is the sum of the differences between max_depth−min_depth for all inputs in this subcircuit. Since the only input in this example is i1, the delta for this circuit is 1−0=1. Next, each input has its level labeled as delta−min_delay+1, which in this example is 1−0+1=2. Thus, unlike prior art which would always label the depth of an input as 1, here i1 will attain level 2. Then, the additive diameter portion for each gate would be derived relative to the resulting levels of each input, which in this case results in labelling r2 and C1 as having level 3. With this method, the diameter value for the simple reconvergent paths to the strongly connected component C1 in FIG. 3A would evaluate to 3 rather than 2, as would have been calculated by prior art methods. This is generally necessary as per the above description of the example of FIG. 3A, since the initial value of r1 may constrain the value of i1 at time 0 to ensure a specific valuation at the output of a1 to C1. This restraint on the value of i1 may prevent i1 from taking a certain valuation until time 1, which takes an additional timestep to propagate through r2 to C1. The complete additive diameter for each gate in the overall subnetlist would then be determined as the level of the resulting gate.

Figure 6:
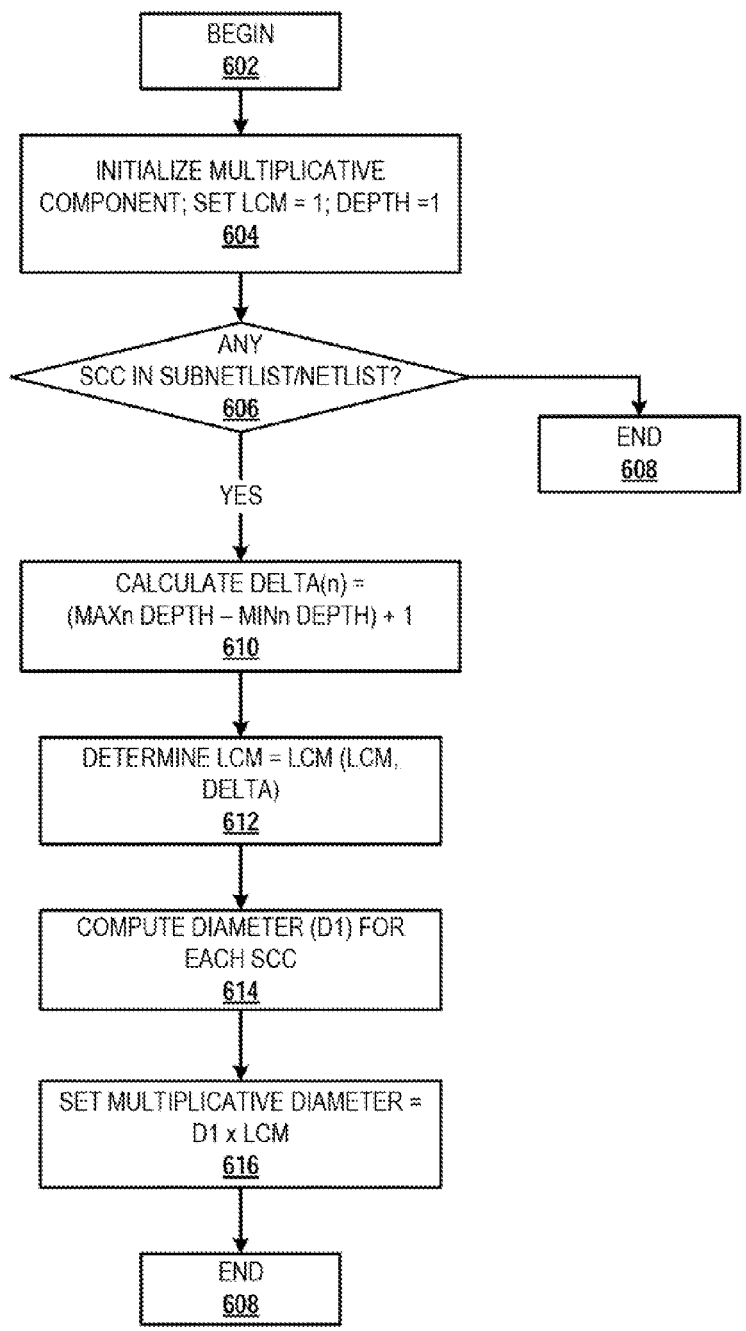
FIG. 6 is a flow chart illustrating a computer-implementable method for performing multiplicative diameter boundary computation for complex feed-forward components with reconvergent input paths of differing depths, according to one embodiment.

Third module 230 of ODBO tools 125 provides program code for processor execution of algorithm 3 on example DPS 100. The pseudo code of algorithm 3 is presented below. When executed, the code provides a method for computing a tight multiplicative diameter bound of the netlist and/or a method to tightly overapproximate the multiplicative component of diameter bounding. The multiplicative diameter calculation can be described with reference to FIGS. 3B and 3C, because each of these subnetlists provides binate reconvergence of different depths. According to one aspect, when the difference between the maximum depth and minimum depth of the different paths is n time steps, calculation of the multiplicative diameter of the path requires a multiplication by n. The method is generally illustrated by FIG. 6 and described after the pseudo code for algorithm 3 presented below.

function compute_multiplicative_diameter(Netlist N)
1. if N has no strongly connected components, return // multiplicative diameter is 0
2. list=function mark_reconvergent_inputs(N)
3. lcm=1
4. for each input I in list for which (i.inverted && i.uninverted)
5. delta=I.max_depth−I.min_depth+1
6. lcm=least common multiple(lcm, delta)
7. d1=compute_scc_diameter(N)
8. diameter=d1*lcm Method 600 of FIG. 6 begins at block 602 and proceeds to block 604 at which algorithm 3 of third module 230 (FIG. 2) in initialized and receives reconvergent acyclic components data 2 217 as inputs from algorithm 1. Initialization of algorithm 3 can include setting the default value of the lowest common multiple (LCM) to 1. Then, method 600 checks the input data and determines at block 606 whether there are any strongly connected components within the subnetlist or netlist. According to one aspect of the disclosure, if the netlist has no strongly connected components (as determined during the analysis of algorithm 1), the reconvergent fanout will not impact multiplicative diameter, and the method 600 ends without impacting the calculation of the diameter bound (block 608). Thus, in such a scenario, the above described algorithm 2 can be adequate to tightly compute diameter bounds for the entire netlist. Otherwise, if there are strongly connected components with reconvergent fanout within the netlist, method 600 can trigger computation of the multiplicative diameter by calling function mark_reconvergent_inputs(N). In one embodiment, method 600 is initiated by algorithm 3 making a call to function mark_reconvergent_inputs from algorithm 1 to identify inputs that have reconvergent fanout of differing delays. Regardless of how the inputs are received and/or determined, method 600 next calculates and/or determines for the binate reconvergent inputs a value of variable "delta" as the difference between the maximum depth and the minimum depth plus 1 (block 610). Method 600 then computes the least common multiple (LCM) across the differing delays for the various deltas calculated, i.e., the LCM of the deltas for each of the fan out inputs with reconvergent paths (block 612). Method 600 then computes the diameter value for each of the strongly connected component(s) (block 614). Following, method 600 computes the multiplicative diameter of the subnetlist as the result of the least common multiple multiplied by the diameter bound for the strongly-connected components of the netlist (block 616), as presented at lines 7-8 of algorithm 3. The method then proceeds to termination block 608.

According to one embodiment, the diameter bound can be computed as being linear in the number of correlated "table rows" and exponential in the number of complex registers.

With the additive diameter bound and the multiplicative diameter bound computed, the results can be forwarded to fourth module 240, which contains the code for implementing algorithm 4 when executed by processor 105. The pseudo code is as follows.

compute_diameter_bound_overapprox (N)
1. for each target 't' in N
2. create sub-netlist N': fanin core of T
3. compute_additive_diameter (N')
4. a=t.level
5. m=compute_multiplicative_diameter (N')
6. d=a+m
7. return BMC (d)

Figure 7:
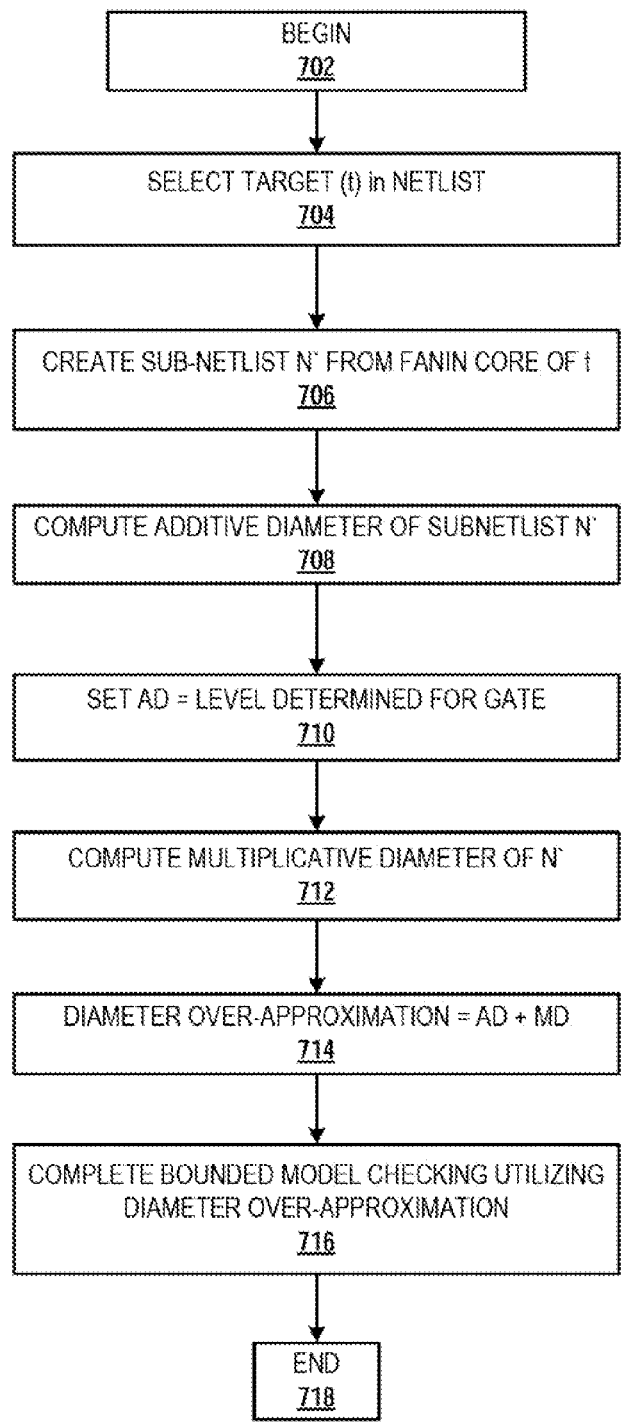
FIG. 7 is a flow chart illustrating a computer-implementable method for calculating a tight and/or optimal over-approximation of a diameter bound for performing bounded model checking of a subnetlist having complex feed-forward components with reconvergent input paths of differing depths, according to one embodiment.

FIG. 7 is a flow chart illustrating the method 700 implemented by execution by processor 105 of code corresponding to algorithm 4. Method 700 begins at block 702 and proceeds to block 704 at which method identifies one or more targets within candidate netlist 116. Method 700 generates the corresponding subnetlist(s) of the target(s) comprised of the fanin cone of the target(s) (block 706). Method 700 then triggers the computation of the additive diameter of the subnetlist utilizing algorithms 1 and 2 (block 708). Method 700 sets the additive diameter to be equal to the level for the gate as recorded by algorithm 2 (block 710). Method 700 then triggers the computation of the multiplicative diameter of the subnetlist (block 712) as per algorithm 3. With the values of the additive and multiplicative diameters returned, method 700 calculates the diameter over-approximation by summing the values of the additive diameter and the multiplicative diameter (block 714). Method then returns the bounded model checking result (BMC(D) 245) utilizing the calculated diameter over-approximation (block 716). As provided herein, bounded model checking is a verification framework which exhaustively analyzes design behavior for a specified number of timesteps. If any flaw—i.e. target assertion—is identified within that analysis, the design is known to be flawed. However, if no target assertion is identified within that analysis, the result of the analysis does not generally provide enough information to know whether the design is correct since it is possible that bounded model checking for an additional timestep would identify a flaw. However, when an over-approximate diameter is known evaluated at block 716, a conclusion can be safely made that a bounded model check for that many timesteps which identifies no flaws implies a correct design. Further, since the resources necessary for bounded model checking is generally exponential with respect to the number of timesteps for which the check is performed, knowing a tight over-approximate diameter bound as provided at block 716 is necessary for efficiency of the overall verification process. Method 700 then ends at block 718. Thus, method 700 provides an optimal verification utilizing bounded model checking and diameter bounding over-approximation for efficient verification. More specifically, the above described method(s) provide for optimal bounding (with tight over-approximating) of the state space diameter of a sequential circuit with acyclic reconvergent paths having different delays.

When the above methods are applied to the example unate acyclic reconvergent paths of FIG. 3A and binate acyclic reconvergent paths of FIGS. 3B and 3C, the additive and multiplicative diameters and resulting over-approximation generated are provided within table 800 of FIG. 8. The table provides columns with the following list of entries: example subnetlist, maximum and minimum path delays, delta, additive diameter, LCM, multiplicative diameter, final diameter over-approximation. As can be seen, the diameter over-approximation does account for these special acyclic reconvergent paths, with differing delays, and implementation of the disclosure particularly prevents the under-approximation that would otherwise occur without the benefits of the methods of the present disclosure. Within the examples presented, the diameter of the strongly connected components is assumed to be the same value of 4 for each example subnetlist, such that the SCC diameter of C1 is 4.

The above described embodiments of the disclosure provides a method that includes a processor of a computing device identifying, within the netlist, one or more strongly connected components (SCCs) and identifying at least one SCC of the one or more SCCs that has a reconvergent fanin input with at least two input paths from the reconvergent fanin input having a different propagation delay to the SCC. The method then includes: computing an additive diameter for the at least one SCC, where the additive diameter includes a fanin additive diameter determined based on a propagation delay difference of the at least two input paths to the SCC and a number of complex feed-forward components within at least one input path; and in response to the reconvergent fanin input to the SCC providing a binate function, computing a multiplicative diameter for the SCC utilizing a least common multiple (LCM) derived from one or more propagation delay differences across each reconvergent fanin input leading to the SCC. In one embodiment, the method further comprises: determining a final diameter bound over-approximation for the netlist utilizing the additive diameter of the at least one SCC; and performing bounded model checking for the netlist utilizing the final diameter bound over-approximation.

According to one embodiment, computing the additive diameter bound includes: calculating a difference between the maximum delay and the minimum delay for the input paths of a first reconvergent fanin input to the SCC; in response to the minimum delay being equal to the maximum delay, where the difference equals zero, setting a level of the first reconvergent fanin input to 1; and in response to the difference not being equal to zero, computing an initial value of the additive diameter by subtracting the minimum delay from the difference and adding 1, assigning the initial value as the level of the first reconvergent fanin input, and assigning each reconvergent fanin input with a level determined by computing a propagation delay difference for input paths of that reconvergent fannin input minus the minimum delay plus 1. With the initial values established for the reconvergent fanin inputs, the method further provides: recursively traversing a fanin of each gate and marking a level of each gate as a largest level of any of the inputs to that gate; determining whether the gate is a register that is not within the SCC; in response to one of (a) the gate not being a register and (b) the gate being a register that is within the SCC, maintaining the level of the gate as the largest level of the inputs to the gate and assigning the same level to all gates within the SCC; in response to the gate being a registers that is not within a SCC, generating a new level by incrementing the largest level of the inputs to the gate by one (1) and assigning the gate with the new level; and identifying the level of each gate as the additive diameter of that gate.

In one or more embodiments, computing the additive diameter for a reconvergent fanin input further includes: calculating a propagation delay difference between a maximum delay path to a SCC and a minimum delay path to the SCC for each reconvergent fanin input; subtracting a value of a minimum delay on the minimum delay path from the propagation delay difference to generate a resulting delta value; incrementing the resulting delta value by a preset factor to generate an initial value of the additive diameter; and assigning the initial value to a corresponding reconvergent fanning input; and computing the final additive diameter as the maximum value of the sum of the assigned initial value of any input plus the maximum number of any non-SCC registers in the fanout of said reconvergent fanin input.

According to a next embodiment, computing the multiplicative diameter bound includes: in response to identifying binate reconvergence of at least one input to the at least one SCC, determining a delta value corresponding to a difference between the maximum depth and the maximum depth for each reconvergent fanin input to the at least one SCC; computing the LCM of one or more delta values determined for each of the reconvergent fanin inputs; determining the multiplicative diameter of the SCC; and computing the final multiplicative diameter as a product of the LCM multiplied by the multiplicative diameter value of the SCC.

In one or more embodiments, determining the final diameter bound over-approximation for the netlist comprises: computing a final additive diameter for the netlist, wherein the final additive diameter comprises the additive diameter of the reconvergent fanin input; responsive to the reconvergent fanin input providing a binate function, computing a final multiplicative diameter for the netlist, wherein the final multiplicative diameter is determined as a product of a cyclic multiplicative diameter of the SCC and a least common multiple (LCM) factor derived from one of more multiplicative diameters of one or more reconvergent fanin inputs; and adding the final additive diameter with the final multiplicative diameter to generate the diameter bound over-approximation for utilization during bounded model checking of the netlist.

Further, one or more embodiments provide that: identifying the one or more strongly connected components (SCCs) and the at least one SCC of the one or more SCCs that has a reconvergent fanin input with at least two input paths having a different propagation delay to the SCC comprises: synthesizing the netlist into an And/Inverter Graph format in which combinational logic gates are AND gates and inversions are implicit as edge attributes; iteratively passing through each gate of the netlist to identify strongly connected components; and for each SCC identified, iteratively selecting a gate sourcing an input edge to a SCC; traversing each path from an input to the gate; determining a maximum depth and a minimum depth at which a selected gate is encountered by counting a number of acyclic registers encountered between the input and the gate along the different paths; determining when the minimum depth and maximum depth to the gate are different; adding the reconvergent fanin input to a generated list of inputs for SCCs that have reconvergent fanin inputs with different maximum and minimum depths and for which additional computation is required to determine a correct additive diameter of a respective SCC.

The described embodiments of the method further includes: determining whether the reconvergent fanin input to the SCC provides a binate function by identifying an inversion polarity of the reconvergent fanin input to the SCC, wherein the inversion polarity identifies one of (a) a same even or odd polarity of inversions on each of the different input paths of the reconvergent fanin input, and (b) a different polarity of inversions on the different input paths, wherein the polarity on an input path is determined by counting a number of inversions along each input path of the reconvergent fanin input and wherein the inversion polarity of the reconvergent fanin input is (a) positive in response to both input paths having an odd number of inversions or both input paths having an even number of inversions or (b) negative in response to a first input path having an odd number of inversions and a second input path having an even number of inversions. Then, in response to the inversion polarity for the reconvergent fanin input being negative, recording inversion polarity information for the reconvergent fanin input, and identifying the reconvergent fanin input as one for which additional computation is required to determine a correct multiplicative diameter of a respective SCC.

In each of the flow charts above, one or more of the methods may be embodied in a computer readable medium containing computer readable code such that a series of functions are performed when the computer readable code is executed on a computing device. In some implementations, certain steps of the methods are combined, performed simultaneously or in a different order, or perhaps omitted, without deviating from the spirit and scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

As will be appreciated by one skilled in the art, aspects of the present disclosure may be embodied as a system, method or computer program product. Accordingly, aspects of the present disclosure may take the form of an entirely hardware embodiment or an embodiment combining software (including firmware, resident software, micro-code, etc.) and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, R.F, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present disclosure may be implemented using any combination of software, firmware or hardware. As a preparatory step to practicing the disclosure in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the disclosure. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the disclosure may be practiced by combining one or more machine-readable storage devices containing the code according to the present disclosure with appropriate processing hardware to execute the code contained therein. An apparatus for practicing the disclosure could be one or more processing devices and storage systems containing or having network access to program(s) coded in accordance with the disclosure.

Thus, it is important that while an illustrative embodiment of the present disclosure is described in the context of a fully functional computer (server) system with installed (or executed) software, those skilled in the art will appreciate that the software aspects of an illustrative embodiment of the present disclosure are capable of being distributed as a program product in a variety of forms, and that an illustrative embodiment of the present disclosure applies equally regardless of the particular type of media used to actually carry out the distribution.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method for determining a tight diameter bound of a netlist having at least one complex feed-forward component, the method comprising:
   a processor of a computing device identifying, within the netlist, one or more strongly connected components (SCCs), and identifying at least one SCC of the one or more SCCs that has a reconvergent fanin input with at least two input paths from the reconvergent fanin input having a different propagation delay to the SCC;
   in response to identifying the at least one SCC, computing an additive diameter for the at least one SCC, wherein the additive diameter includes a fanin additive diameter determined based on a propagation delay difference of the at least two input paths to the SCC;
   in response to the reconvergent fanin input to the SCC providing a binate function, computing a multiplicative diameter for the SCC utilizing a least common multiple (LCM) derived from one or more propagation delay differences across each reconvergent fanin input leading to the SCC;
   determining a final diameter bound over-approximation for the netlist by:
      computing a final additive diameter for the netlist, wherein the final additive diameter comprises the additive diameter of the reconvergent fanin input;
      responsive to the reconvergent fanin input providing a binate function, computing a final multiplicative diameter for the netlist, wherein the final multiplicative diameter is determined as a product of a cyclic multiplicative diameter of the SCC and a least common multiple (LCM) factor derived from one of more multiplicative diameters of one or more reconvergent fanin inputs; and
      adding the final additive diameter with the final multiplicative diameter to generate the diameter bound over-approximation for utilization during bounded model checking of the netlist.

2. The method of claim 1, further comprising:
   determining a final diameter bound over-approximation for the netlist utilizing the additive diameter of the at least one SCC; and
   performing bounded model checking for the netlist utilizing the final diameter bound over-approximation.

3. The method of claim 1, wherein identifying the one or more strongly connected components (SCCs) and the at least one SCC of the one or more SCCs that has a reconvergent fanin input with at least two input paths having a different propagation delay to the SCC comprises:
   synthesizing the netlist into an And/Inverter Graph format in which combinational logic gates are AND gates and inversions are implicit as edge attributes;
   iteratively passing through each gate of the netlist to identify strongly connected components; and
   for each SCC identified, iteratively selecting a gate sourcing an input edge to the SCC; traversing each path from an input to the gate; determining a maximum depth and a minimum depth at which a selected gate is encountered by counting a number of acyclic registers encountered between the input and the gate along the different paths; determining when the minimum depth and maximum depth to the gate are different; adding the reconvergent fanin input to a generated list of inputs for SCCs that have reconvergent fanin inputs with different maximum and minimum depths and for which additional computation is required to determine a correct additive diameter of a respective SCC.

4. The method of claim 3, further comprising:
   determining whether the reconvergent fanin input to the SCC provides a binate function by identifying an inversion polarity of the reconvergent fanin input to the SCC, wherein the inversion polarity identifies one of (a) a same even or odd polarity of inversions on each of the different input paths of the reconvergent fanin input, and (b) a different polarity of inversions on the different input paths, wherein the polarity on an input path is determined by counting a number of inversions along each input path of the reconvergent fanin input and wherein the inversion polarity of the reconvergent fanin input is (a) positive in response to both input paths having an odd number of inversions or both input paths having an even number of inversions or (b) negative in response to a first input path having an odd number of inversions and a second input path having an even number of inversions; and
   in response to the inversion polarity for the reconvergent fanin input being negative, recording inversion polarity information for the reconvergent fanin input, identifying the reconvergent fanin input as one for which additional computation is required to determine a correct multiplicative diameter of a respective SCC.

5. The method of claim 1, wherein computing an additive diameter for the netlist containing at least one SCC comprises:
   calculating a difference between the maximum delay and the minimum delay for the input paths of a first reconvergent fanin input to the SCC;
   in response to the minimum delay being equal to the maximum delay, wherein the difference equals zero, setting a level of the first reconvergent fanin input to 1; and
   in response to the difference not being equal to zero, computing an initial value of the additive diameter of the reconvergent fanin input by subtracting the minimum delay from the difference and adding 1, assigning the initial value as the level of the first reconvergent fanin input, and assigning each reconvergent fanin input with a level determined by computing a propagation delay difference for input paths of that reconvergent fannin input minus the minimum delay plus 1.

6. The method of claim 5, further comprising:
   recursively traversing a fanin of each gate and marking a level of each gate as a largest level of any of the inputs to that gate;
   determining whether the gate is a register that is not within the SCC;

in response to one of (a) the gate not being a register and (b) the gate being a register that is within the SCC, maintaining the level of the gate as the largest level of the inputs to the gate and assigning the same level to all gates within the SCC;

in response to the gate being a register that is not within a SCC, generating a new level by incrementing the largest level of the inputs to the gate by one (1) and assigning the gate with the new level; and identifying the level of each gate as the additive diameter of that gate.

7. The method of claim 1, wherein computing a multiplicative diameter further comprises:

in response to identifying binate reconvergence of at least one input to the at least one SCC, determining a delta value corresponding to a difference between the maximum depth and the maximum depth for each reconvergent fanin input to the at least one SCC;

computing the LCM of one or more delta values determined for each of the reconvergent fanin inputs;

determining the multiplicative diameter of the SCC; and computing the final multiplicative diameter as a product of the LCM multiplied by the multiplicative diameter value of the SCC.

8. The method of claim 1, wherein computing the additive diameter for a reconvergent fanin input further comprises:

calculating a propagation delay difference between a maximum delay path to a SCC and a minimum delay path to the SCC for each reconvergent fanin input;

subtracting a value of a minimum delay on the minimum delay path from the propagation delay difference to generate a resulting delta value;

incrementing the resulting delta value by a preset factor to generate an initial value of the additive diameter;

assigning the initial value to a corresponding reconvergent fanning input; and computing the final additive diameter as the maximum value of the sum of the assigned initial value of any input plus the maximum number of any non-SCC registers in the fanout of said reconvergent fanin input.

9. A computing device comprising a processor, an input device, an output device, and a memory with program code that is executed by the processor to cause the computing device to:

identify, within the netlist having at least one complex feed-forward component, one or more strongly connected components (SCCs), and identifying at least one SCC of the one or more SCCs that has a reconvergent fanin input with at least two input paths from the reconvergent fanin input having a different propagation delay to the SCC;

in response to identifying the at least one SCC, compute an additive diameter for the at least one SCC, wherein the additive diameter includes a fanin additive diameter determined based on a propagation delay difference of the at least two input paths to the SCC;

in response to the reconvergent fanin input to the SCC providing a binate function, compute a multiplicative diameter for the SCC utilizing a least common multiple (LCM) derived from one or more propagation delay differences across each reconvergent fanin input leading to the SCC;

compute a final additive diameter for the netlist, wherein the final additive diameter comprises the additive diameter of the reconvergent fanin input;

responsive to the reconvergent fanin input providing a binate function, compute a final multiplicative diameter for the netlist, wherein the final multiplicative diameter is determined as a product of a cyclic multiplicative diameter of the SCC and a least common multiple (LCM) factor derived from one of more multiplicative diameters of one or more reconvergent fanin inputs; and add the final additive diameter with the final multiplicative diameter to generate a final diameter bound over-approximation for utilization during bounded model checking of the netlist.

10. The computing device of claim 9, wherein the program code further comprises program code that causes the computing device to:

determine a final diameter bound over-approximation as a tight diameter bound for the netlist utilizing the additive diameter of the at least one SCC; and perform bounded model checking for the netlist utilizing the final diameter bound over-approximation.

11. The computing device of claim 9, wherein the program code that identifies the one or more strongly connected components (SCCs) and the at least one SCC of the one or more SCCs that has a reconvergent fanin input with at least two input paths having a different propagation delay to the SCC comprises program code that causes the computing device to:

synthesize the netlist into an And/Inverter Graph format in which combinational logic gates are AND gates and inversions are implicit as edge attributes;

iteratively pass through each gate of the netlist to identify strongly connected components; and for each SCC identified, iteratively select a gate sourcing an input edge to the SCC; traversing each path from an input to the gate; determining a maximum depth and a minimum depth at which a selected gate is encountered by counting a number of acyclic registers encountered between the input and the gate along the different paths; determining when the minimum depth and maximum depth to the gate are different; adding the reconvergent fanin input to a generated list of inputs for SCCs that have reconvergent fanin inputs with different maximum and minimum depths and for which additional computation is required to determine a correct additive diameter of a respective SCC.

12. The computing device of claim 11, wherein the program code further comprises program code that causes the computing device to:

determine whether the reconvergent fanin input to the SCC provides a binate function by identifying an inversion polarity of the reconvergent fanin input to the SCC, wherein the inversion polarity identifies one of (a) a same even or odd polarity of inversions on each of the different input paths of the reconvergent fanin input, and (b) a different polarity of inversions on the different input paths, wherein the polarity on an input path is determined by counting a number of inversions along each input path of the reconvergent fanin input and wherein the inversion polarity of the reconvergent fanin input is (a) positive in response to both input paths having an odd number of inversions or both input paths having an even number of inversions or (b) negative in response to a first input path having an odd number of inversions and a second input path having an even number of inversions; and in response to the inversion polarity for the reconvergent fanin input being negative, record inversion polarity information for the reconvergent fanin input, identifying the reconvergent fanin input as one for which additional computation is required to determine a correct multiplicative diameter of a respective SCC.

13. The computing device of claim 9, wherein the program code that causes the computing device to compute the additive diameter for the netlist containing at least one SCC further comprises program code that causes the computing device to:
  calculate a difference between the maximum delay and the minimum delay for the input paths of a first reconvergent fanin input to the SCC;
  in response to the minimum delay being equal to the maximum delay, wherein the difference equals zero, set a level of the first reconvergent fanin input to 1;
  in response to the difference not being equal to zero, compute an initial value of the additive diameter of the reconvergent fanin input by subtracting the minimum delay from the difference and adding 1, assign the initial value as the level of the first reconvergent fanin input, and assign each reconvergent fanin input with a level determined by computing a propagation delay difference for input paths of that reconvergent fannin input minus the minimum delay plus 1;
  recursively traverse a fanin of each gate and marking a level of each gate as a largest level of any of the inputs to that gate;
  determine whether the gate is a register that is not within the SCC;
  in response to one of (a) the gate not being a register and (b) the gate being a register that is within the SCC, maintain the level of the gate as the largest level of the inputs to the gate and assigning the same level to all gates within the SCC;
  in response to the gate being a register that is not within a SCC, generate a new level by incrementing the largest level of the inputs to the gate by one (1) and assigning the gate with the new level; and
  identify the level of each gate as the additive diameter of that gate.

14. The computing device of claim 9, wherein the program code that causes the computing device to compute a multiplicative diameter further comprises program code that causes the computing device to:
  in response to identifying binate reconvergence of at least one input to the at least one SCC, determine a delta value corresponding to a difference between the maximum depth and the maximum depth for each reconvergent fanin input to the at least one SCC;
  compute the LCM of one or more delta values determined for each of the reconvergent fanin inputs;
  determine the multiplicative diameter of the SCC; and
  compute the final multiplicative diameter as a product of the LCM multiplied by the multiplicative diameter value of the SCC.

15. The computing device of claim 9, wherein the program code that causes the computing device to compute the additive diameter for a reconvergent fanin input further comprises program code that causes the computing device to:
  calculate a propagation delay difference between a maximum delay path to a SCC and a minimum delay path to the SCC for each reconvergent fanin input;
  subtract a value of a minimum delay on the minimum delay path from the propagation delay difference to generate a resulting delta value;
  increment the resulting delta value by a preset factor to generate an initial value of the additive diameter;
  assign the initial value to a corresponding reconvergent fanning input; and
  compute the final additive diameter as the maximum value of the sum of the assigned initial value of any input plus the maximum number of any non-SCC registers in the fanout of said reconvergent fanin input.

16. A computer program product comprising:
  a computer readable storage device; and
  program code on the computer readable storage device, which program code is configured to be executed by a processor within a computing device to cause the computing device to:
    identify, within the netlist having at least one complex feed-forward component, one or more strongly connected components (SCCs), and identifying at least one SCC of the one or more SCCs that has a reconvergent fanin input with at least two input paths from the reconvergent fanin input having a different propagation delay to the SCC;
    compute an additive diameter for the at least one SCC, wherein the additive diameter includes a fanin additive diameter determined based on a propagation delay difference of the at least two input paths to the SCC;
    in response to the reconvergent fanin input to the SCC providing a binate function, compute a multiplicative diameter for the SCC utilizing a least common multiple (LCM) derived from one or more propagation delay differences across each reconvergent fanin input leading to the SCC;
    compute a final additive diameter for the netlist, wherein the final additive diameter comprises the additive diameter of the reconvergent fanin input;
    responsive to the reconvergent fanin input providing a binate function, compute a final multiplicative diameter for the netlist, wherein the final multiplicative diameter is determined as a product of a cyclic multiplicative diameter of the SCC and a least common multiple (LCM) factor derived from one of more multiplicative diameters of one or more reconvergent fanin inputs; and
    adding the final additive diameter with the final multiplicative diameter to generate the diameter bound over-approximation for utilization during bounded model checking of the netlist.

17. The computer program product of claim 16, wherein the program code further comprises program code that causes the computing device to:
  determine a final diameter bound over-approximation as a tight diameter bound for the netlist utilizing the additive diameter of the at least one SCC; and
  perform bounded model checking for the netlist utilizing the final diameter bound over-approximation.

18. The computer program product of claim 16, wherein the program code that identifies the one or more strongly connected components (SCCs) and the at least one SCC of the one or more SCCs that has a reconvergent fanin input with at least two input paths having a different propagation delay to the SCC comprises program code that causes the computing device to:
  synthesize the netlist into an And/Inverter Graph format in which combinational logic gates are AND gates and inversions are implicit as edge attributes;
  iteratively pass through each gate of the netlist to identify strongly connected components; and
  for each SCC identified, iteratively select a gate sourcing an input edge to the SCC; traversing each path from an input to the gate; determining a maximum depth and a minimum depth at which a selected gate is encountered by counting a number of acyclic registers encountered between the input and the gate along the different paths;

determining when the minimum depth and maximum depth to the gate are different; adding the reconvergent fanin input to a generated list of inputs for SCCs that have reconvergent fanin inputs with different maximum and minimum depths and for which additional computation is required to determine a correct additive diameter of a respective SCC.

19. The computer program product of claim 18, wherein the program code further comprises program code that causes the computing device to:
determine whether the reconvergent fanin input to the SCC provides a binate function by identifying an inversion polarity of the reconvergent fanin input to the SCC, wherein the inversion polarity identifies one of (a) a same even or odd polarity of inversions on each of the different input paths of the reconvergent fanin input, and (b) a different polarity of inversions on the different input paths, wherein the polarity on an input path is determined by counting a number of inversions along each input path of the reconvergent fanin input and wherein the inversion polarity of the reconvergent fanin input is (a) positive in response to both input paths having an odd number of inversions or both input paths having an even number of inversions or (b) negative in response to a first input path having an odd number of inversions and a second input path having an even number of inversions; and
in response to the inversion polarity for the reconvergent fanin input being negative, record inversion polarity information for the reconvergent fanin input, identifying the reconvergent fanin input as one for which additional computation is required to determine a correct multiplicative diameter of a respective SCC.

20. The computer program product of claim 16, wherein the program code that causes the computing device to compute the additive diameter for the netlist containing at least one SCC further comprises program code that causes the computing device to:
calculate a difference between the maximum delay and the minimum delay for the input paths of a first reconvergent fanin input to the SCC;
in response to the minimum delay being equal to the maximum delay, wherein the difference equals zero, set a level of the first reconvergent fanin input to 1;
in response to the difference not being equal to zero, compute an initial value of the additive diameter of the reconvergent fanin input by subtracting the minimum delay from the difference and adding 1, assign the initial value as the level of the first reconvergent fanin input, and assign each reconvergent fanin input with a level determined by computing a propagation delay difference for input paths of that reconvergent fannin input minus the minimum delay plus 1;
recursively traverse a fanin of each gate and marking a level of each gate as a largest level of any of the inputs to that gate;
determine whether the gate is a register that is not within the SCC;
in response to one of (a) the gate not being a register and (b) the gate being a register that is within the SCC, maintain the level of the gate as the largest level of the inputs to the gate and assigning the same level to all gates within the SCC;
in response to the gate being a register that is not within a SCC, generate a new level by incrementing the largest level of the inputs to the gate by one (1) and assigning the gate with the new level; and
identify the level of each gate as the additive diameter of that gate.

21. The computer program product of claim 16, wherein the program code that causes the computing device to compute a multiplicative diameter further comprises program code that causes the computing device to:
in response to identifying binate reconvergence of at least one input to the at least one SCC, determine a delta value corresponding to a difference between the maximum depth and the maximum depth for each reconvergent fanin input to the at least one SCC;
compute the LCM of one or more delta values determined for each of the reconvergent fanin inputs;
determine the multiplicative diameter of the SCC; and
compute the final multiplicative diameter as a product of the LCM multiplied by the multiplicative diameter value of the SCC.

22. The computer program product of claim 16, wherein the program code that causes the computing device to compute the additive diameter for a reconvergent fanin input further comprises program code that causes the computing device to:
calculate a propagation delay difference between a maximum delay path to a SCC and a minimum delay path to the SCC for each reconvergent fanin input;
subtract a value of a minimum delay on the minimum delay path from the propagation delay difference to generate a resulting delta value;
increment the resulting delta value by a preset factor to generate an initial value of the additive diameter;
assign the initial value to a corresponding reconvergent fanning input; and
compute the final additive diameter as the maximum value of the sum of the assigned initial value of any input plus the maximum number of any non-SCC registers in the fanout of said reconvergent fanin input.

* * * * *